(12) United States Patent
Umetsu et al.

(10) Patent No.: US 10,424,724 B2
(45) Date of Patent: Sep. 24, 2019

(54) MAGNETIC ELEMENT AND MAGNETIC MEMORY

(71) Applicant: Toshiba Memory Corporation, Tokyo (JP)

(72) Inventors: Nobuyuki Umetsu, Kawasaki Kanagawa (JP); Tsuyoshi Kondo, Kawasaki Kanagawa (JP); Yasuaki Ootera, Yokohama Kanagawa (JP); Takuya Shimada, Kawasaki Kanagawa (JP); Michael Arnaud Quinsat, Yokohama Kanagawa (JP); Masaki Kado, Yokohama Kanagawa (JP); Susumu Hashimoto, Nerima Tokyo (JP); Shiho Nakamura, Fujisawa Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/911,379

(22) Filed: Mar. 5, 2018

(65) Prior Publication Data

US 2019/0019945 A1   Jan. 17, 2019

(30) Foreign Application Priority Data

Jul. 11, 2017   (JP) ................................ 2017-135641

(51) Int. Cl.
*G11C 11/16* (2006.01)
*H01L 43/08* (2006.01)
(Continued)

(52) U.S. Cl.
CPC ............ *H01L 43/08* (2013.01); *G11C 11/161* (2013.01); *H01L 43/02* (2013.01); *H01L 43/10* (2013.01);
(Continued)

(58) Field of Classification Search
None
See application file for complete search history.

(56) References Cited

U.S. PATENT DOCUMENTS

2012/0135275 A1\*   5/2012   Kariyada ............. G11C 11/161
                                                    428/828.1
2012/0250398 A1   10/2012   Morise et al.
(Continued)

FOREIGN PATENT DOCUMENTS

JP   2012-204802   10/2012
JP   2012-212715   11/2012
(Continued)

*Primary Examiner* — Douglas King
(74) *Attorney, Agent, or Firm* — Finnegan, Henderson, Farabow, Garrett & Dunner, L.L.P.

(57) ABSTRACT

According to one embodiment, a magnetic element includes a first member and a first magnetic portion. The first member includes a first region, a second region, and a third region positioned between the first region and the second region in a first direction. The first region includes at least one first element selected from the group consisting of Au, Ir, Al, Ta, TaN, W, Hf, Pt, and Pd. The second region includes at least one second element selected from the group. The third region includes at least one third element selected from the group. A concentration of the third element in the third region is lower than a concentration of the first element in the first region and lower than a concentration of the second element in the second region. A direction from the first region toward the first magnetic portion is aligned with a second direction.

5 Claims, 15 Drawing Sheets

(51) Int. Cl.
   *H01L 43/02* (2006.01)
   *H01L 43/10* (2006.01)
   *H01L 43/12* (2006.01)

(52) U.S. Cl.
   CPC ....... *G11C 11/1673* (2013.01); *G11C 11/1675* (2013.01); *H01L 43/12* (2013.01)

(56) References Cited

U.S. PATENT DOCUMENTS

| | | |
|---|---|---|
| 2012/0250406 A1 | 10/2012 | Morise et al. |
| 2013/0242647 A1* | 9/2013 | Nakamura ............ G11C 11/14 365/158 |
| 2014/0085970 A1 | 3/2014 | Kondo et al. |
| 2014/0104941 A1* | 4/2014 | Kondo .................... G11C 11/02 365/171 |
| 2014/0119111 A1* | 5/2014 | Nakamura ............. H01L 43/08 365/171 |
| 2014/0140126 A1 | 5/2014 | Morise et al. |
| 2014/0241030 A1* | 8/2014 | Fukuzumi ............. G11C 19/02 365/80 |
| 2015/0036422 A1 | 2/2015 | Morise et al. |
| 2015/0078071 A1* | 3/2015 | Nakamura ............ G11C 11/161 365/158 |
| 2016/0247550 A1 | 8/2016 | Fukami et al. |
| 2016/0276404 A1* | 9/2016 | Nakamura ............ H01L 27/222 |
| 2017/0069829 A1* | 3/2017 | Morise .................... H01L 43/02 |
| 2017/0077174 A1 | 3/2017 | Kondo et al. |
| 2017/0229640 A1* | 8/2017 | Kado .................. G11C 11/1675 |
| 2018/0254076 A1* | 9/2018 | Morise ............... G11C 19/0841 |

FOREIGN PATENT DOCUMENTS

| | | |
|---|---|---|
| JP | 2014-63936 | 4/2014 |
| JP | 2014-78617 | 5/2014 |
| JP | 2014-103260 | 6/2014 |
| JP | 5649198 B1 | 1/2015 |
| JP | 2015-29024 | 2/2015 |
| JP | 2017-59593 | 3/2017 |
| JP | 2018-147966 A | 9/2018 |
| WO | WO 2015/068509 | 5/2015 |

* cited by examiner

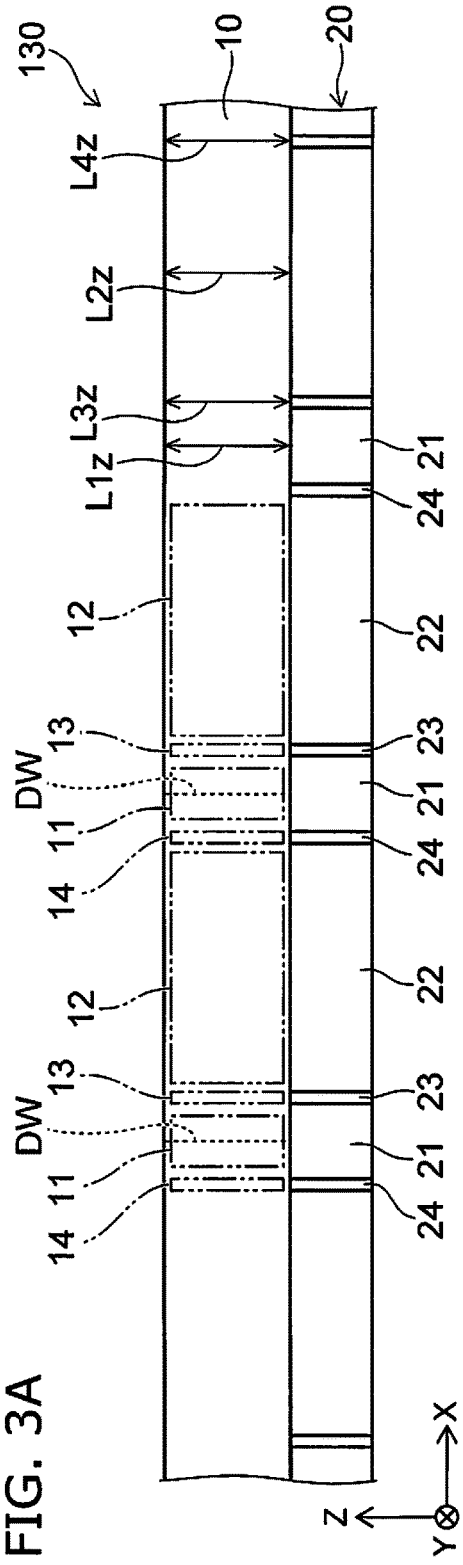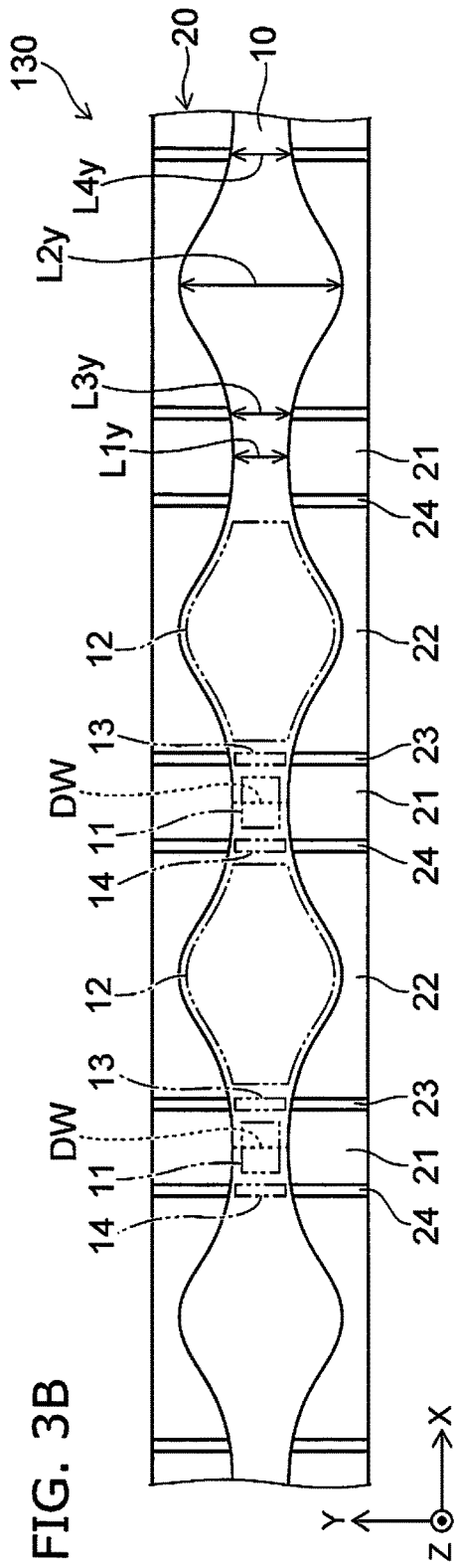

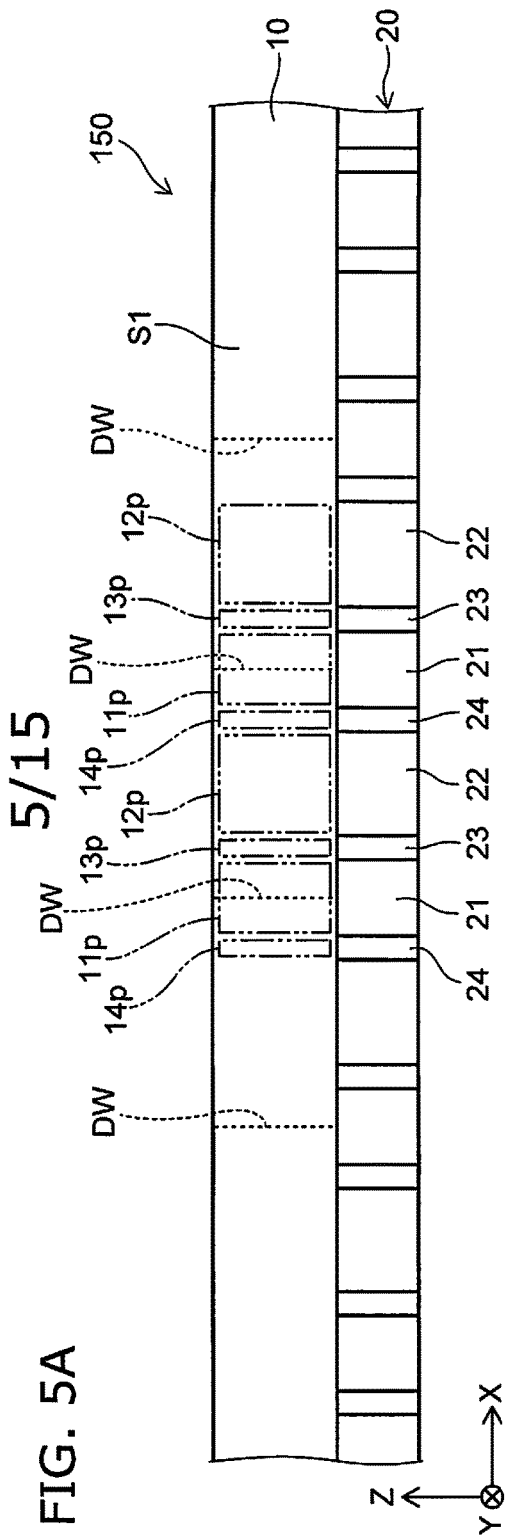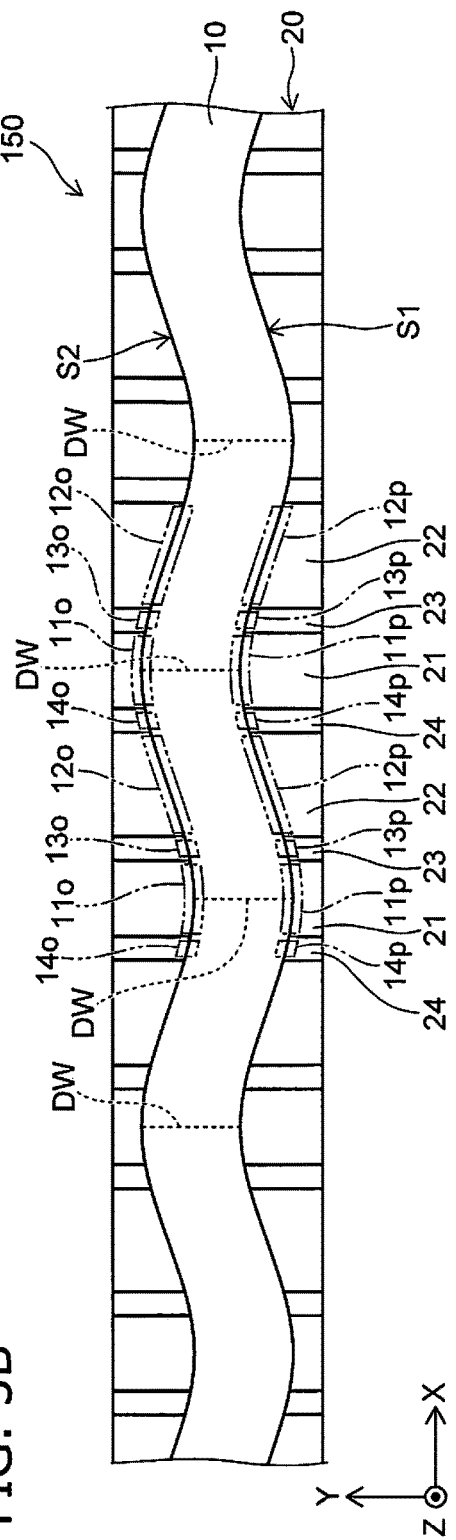
FIG. 5A
FIG. 5B

US 10,424,724 B2

MAGNETIC ELEMENT AND MAGNETIC MEMORY

CROSS-REFERENCE TO RELATED APPLICATIONS

This application is based upon and claims the benefit of priority from Japanese Patent Application No. 2017-135641, filed on Jul. 11, 2017; the entire contents of which are incorporated herein by reference.

FIELD

Embodiments described herein relate generally to a magnetic element and a magnetic memory.

BACKGROUND

For example, there is a magnetic element that uses domain walls. There is a magnetic memory device that uses such a magnetic element. Stable operations of the magnetic element and the magnetic memory device are desirable.

BRIEF DESCRIPTION OF THE DRAWINGS

FIG. 3A is a schematic cross-sectional view illustrating another example of the magnetic element according to the first embodiment and FIG. 3B is a schematic plan view illustrating the example of the magnetic element according to the first embodiment;

FIG. 5A is a schematic cross-sectional view illustrating another example of the magnetic element according to the first embodiment and FIG. 5B is a schematic plan view illustrating the example of the magnetic element according to the first embodiment;

DETAILED DESCRIPTION

Figure 1:
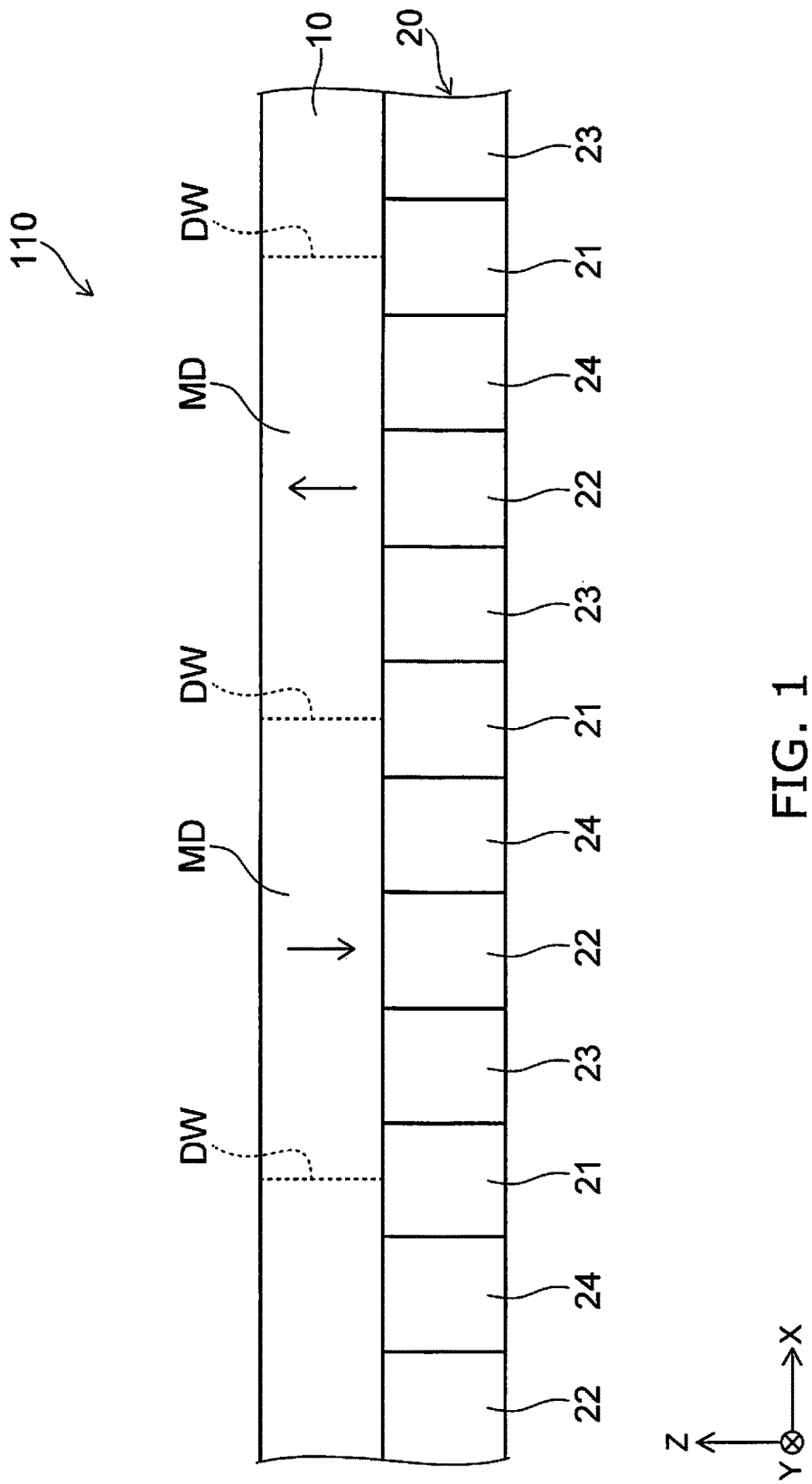
FIG. 1 is a schematic cross-sectional view illustrating an example of a magnetic element according to a first embodiment.

According to one embodiment, a magnetic element includes a first member and a first magnetic portion. The first member includes a first region, a second region, and a third region. The third region is positioned between the first region and the second region in a first direction. The first region includes at least one first element selected from the group consisting of Au, Ir, Al, Ta, TaN, W, Hf, Pt, and Pd. The second region includes at least one second element selected from the group. The third region includes at least one third element selected from the group. A concentration of the third element in the third region is lower than a concentration of the first element in the first region and lower than a concentration of the second element in the second region. A direction from the first region toward the first magnetic portion is aligned with a second direction crossing the first direction.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

FIG. 1 is a schematic cross-sectional view illustrating an example of a magnetic element according to a first embodiment.

The magnetic element 110 illustrated in FIG. 1 includes a first magnetic portion 10 and a first member 20.

The first member 20 includes a first region 21, a second region 22, a third region 23, and a fourth region 24. The second region 22 is separated from the first region 21 in a first direction. The third region 23 is positioned between the first region 21 and the second region 22 in the first direction. The second region 22 is positioned between the third region 23 and the fourth region 24 in the first direction.

For example, the first direction is aligned with an X-axis direction illustrated in FIG. 1. One direction perpendicular to the X-axis direction is taken as a Y-axis direction. A direction perpendicular to the X-axis direction and the Y-axis direction is taken as a Z-axis direction. A direction crossing the first direction is taken as a second direction. For example, the second direction is aligned with the Z-axis direction. A direction crossing a plane including the first direction and the second direction is taken as a third direction. For example, the third direction is aligned with the Y-axis direction.

The case will now be described where the first direction, the second direction, and the third direction are respectively aligned with the X-axis direction, the Z-axis direction, and the Y-axis direction.

The direction from the first region 21 toward the first magnetic portion 10 is aligned with the Z-axis direction. The direction from the second region 22 toward the first magnetic portion 10 is aligned with the Z-axis direction. The direction from the third region 23 toward the first magnetic portion 10 is aligned with the Z-axis direction. The direction from the fourth region 24 toward the first magnetic portion 10 is aligned with the Z-axis direction.

The first magnetic portion 10 includes multiple domain walls DW. The multiple domain walls DW are arranged in the X-axis direction. The region between the mutually-adjacent domain walls DW corresponds to one magnetic domain MD. In FIG. 1, the arrow in the magnetic domain MD illustrates an example of the orientation of the magnetization of the magnetic domain MD.

The first region 21, the second region 22, the third region 23, and the fourth region 24 each are multiply provided in the X-axis direction. For example, one of the multiple second regions 22, one of the multiple third regions 23, and one of the multiple fourth regions 24 are positioned between one of the multiple first regions 21 and another one of the multiple first regions 21 in the X-axis direction.

The first region 21, the second region 22, the third region 23, and the fourth region 24 include, for example, at least one first element selected from the group consisting of Au, Ir, Al, Ta, TaN, W, Hf, Pt, and Pd.

The concentration of the first element in the first region 21 is higher than the concentration of the first element in the third region 23 and higher than the concentration of the first element in the fourth region 24. The concentration of the first element in the second region 22 is higher than the concentration of the first element in the third region 23 and higher than the concentration of the first element in the fourth region 24.

The first member 20 includes multiple first concentration regions and multiple second concentration regions arranged alternately along the X-axis direction. One of the multiple second concentration regions is positioned between one of the multiple first concentration regions and another one of the multiple first concentration regions in the X-axis direction. The concentration of the first element in the first concentration region is higher than the concentration of the first element in the second concentration region. A portion of the multiple first concentration regions corresponds to the first regions 21. Another portion of the multiple first concentration regions corresponds to the second regions 22. A portion of the multiple second concentration regions corresponds to the third regions 23. Another portion of the multiple second concentration regions corresponds to the fourth regions 24. The first region 21 and the second region 22 may include the first element; and the third region 23 and the fourth region 24 may not include the first element.

The first member includes at least the first region 21, the second region 22, and the third region 23. For example, the operational stability of the magnetic element can be improved.

One of the multiple magnetic domains MD included in the first magnetic portion 10 corresponds to one bit datum.

To increase the density of the domain walls DW, it is desirable for the orientations of the magnetizations of the first magnetic portion 10 to be aligned with a direction (e.g., the Z-axis direction) crossing the X-axis direction. Thereby, for example, the density of the domain walls DW can be increased.

For example, the first magnetic portion 10 includes at least one element selected from the group consisting of Fe, Co, Ni, Mn, and Cr and at least one element selected from the group consisting of Pt, Pd, Ir, Ru, and Rh. The first magnetic portion 10 includes, for example, a material having a hcp structure (a hexagonal close-packed structure).

For example, the orientations of the magnetizations of the first magnetic portion 10 are aligned with the Z-axis direction. In such a case, the first magnetic portion 10 includes, for example, at least one selected from the group consisting of Co, CoPt, CoCrPt, FePt, and TbFe.

The first magnetic portion 10 may include a rare-earth element and an iron group transition element. The first magnetic portion 10 includes, for example, at least one selected from the group consisting of GdFe, GdCo, GdFeCo, TbFe, TbCo, TbFeCo, GdTbFe, GdTbCo, DyFe, DyCo, and DyFeCo.

The first magnetic portion 10 may further include at least one selected from the group consisting of Ag, Cu, Au, Al, Mg, Si, Bi, Ta, B, C, O, N, Pd, Pt, Zr, Ir, W, Mo, Nb, and H.

Figure 2:
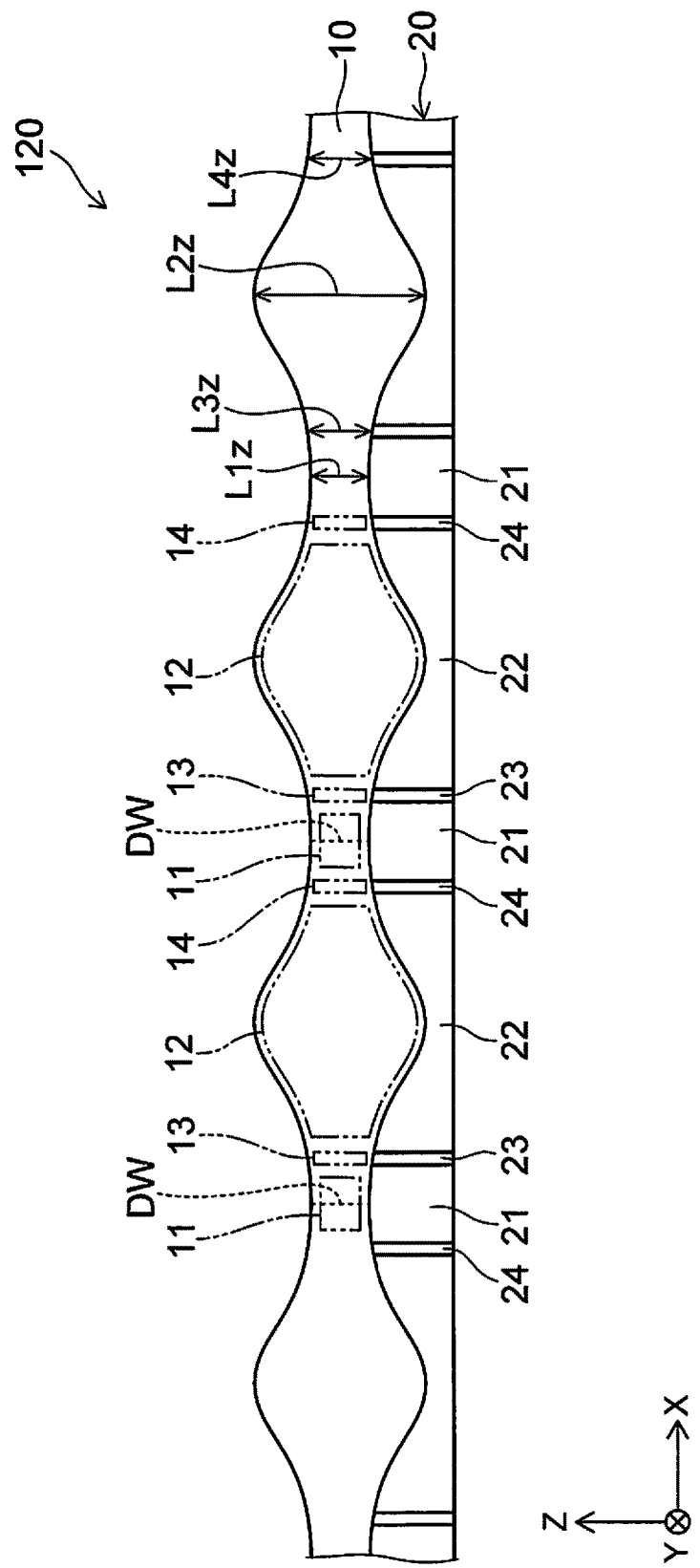
FIG. 2 is a schematic cross-sectional view illustrating another example of the magnetic element according to the first embodiment.

FIG. 2 is a schematic cross-sectional view illustrating another example of the magnetic element according to the first embodiment.

In the magnetic element 120 illustrated in FIG. 2, the first magnetic portion 10 includes a first magnetic region 11, a second magnetic region 12, a third magnetic region 13, and a fourth magnetic region 14.

The second magnetic region 12 is separated from the first magnetic region 11 in the X-axis direction. The third magnetic region 13 is positioned between the first magnetic region 11 and the second magnetic region 12 in the X-axis direction. The second magnetic region 12 is positioned between the third magnetic region 13 and the fourth magnetic region 14 in the X-axis direction.

The direction from the first region 21 toward the first magnetic region 11 is aligned with the Z-axis direction. The direction from the second region 22 toward the second magnetic region 12 is aligned with the Z-axis direction. The direction from the third region 23 toward the third magnetic region 13 is aligned with the Z-axis direction. The direction from the fourth region 24 toward the fourth magnetic region 14 is aligned with the Z-axis direction.

A length L2z in the Z-axis direction of the second magnetic region 12 is longer than a length L3z in the Z-axis direction of the third magnetic region 13 and longer than a length L4z in the Z-axis direction of the fourth magnetic region 14. A length L1z in the Z-axis direction of the first magnetic region 11 is shorter than the length L3z and shorter than the length L4z.

The cross-sectional area along the Y-Z plane of the second magnetic region 12 is greater than the cross-sectional area along the Y-Z plane of the third magnetic region 13 and greater than the cross-sectional area along the Y-Z plane of the fourth magnetic region 14. The cross-sectional area along the Y-Z plane of the first magnetic region 11 is less than the cross-sectional area along the Y-Z plane of the third magnetic region 13 and less than the cross-sectional area along the Y-Z plane of the fourth magnetic region 14.

The cross-sectional area along the Y-Z plane of the first magnetic portion 10 repeatedly changes along the X-axis direction.

FIG. 3A is a schematic cross-sectional view illustrating another example of the magnetic element according to the first embodiment. FIG. 3B is a schematic plan view illustrating the example of the magnetic element according to the first embodiment.

In the magnetic element 130 as illustrated in FIG. 3B, a length L2y in the Y-axis direction of the second magnetic region 12 is longer than a length L3y in the Y-axis direction of the third magnetic region 13 and longer than a length L4y in the Y-axis direction of the fourth magnetic region 14. A length L1y in the Y-axis direction of the first magnetic region 11 is shorter than the length L3y and shorter than the length L4y.

As illustrated in FIG. 3A, the length L1z in the Z-axis direction of the first magnetic region 11 is, for example, the same as the length L2z in the Z-axis direction of the second magnetic region 12, the same as the length L3z in the Z-axis direction of the third magnetic region 13, and the same as the length L4z in the Z-axis direction of the fourth magnetic region 14.

The length L2z may be longer than the length L3z and may be longer than the length L4z. The length L1z may be shorter than the length L3z and may be shorter than the length L4z.

The cross-sectional area along the Y-Z plane of the second magnetic region 12 is greater than the cross-sectional area along the Y-Z plane of the third magnetic region 13 and greater than the cross-sectional area along the Y-Z plane of the fourth magnetic region 14. The cross-sectional area along the Y-Z plane of the first magnetic region 11 is less than the cross-sectional area along the Y-Z plane of the third magnetic region 13 and less than the cross-sectional area along the Y-Z plane of the fourth magnetic region 14.

The cross-sectional area along the Y-Z plane of the first magnetic portion 10 repeatedly changes along the X-axis direction.

Figure 4:
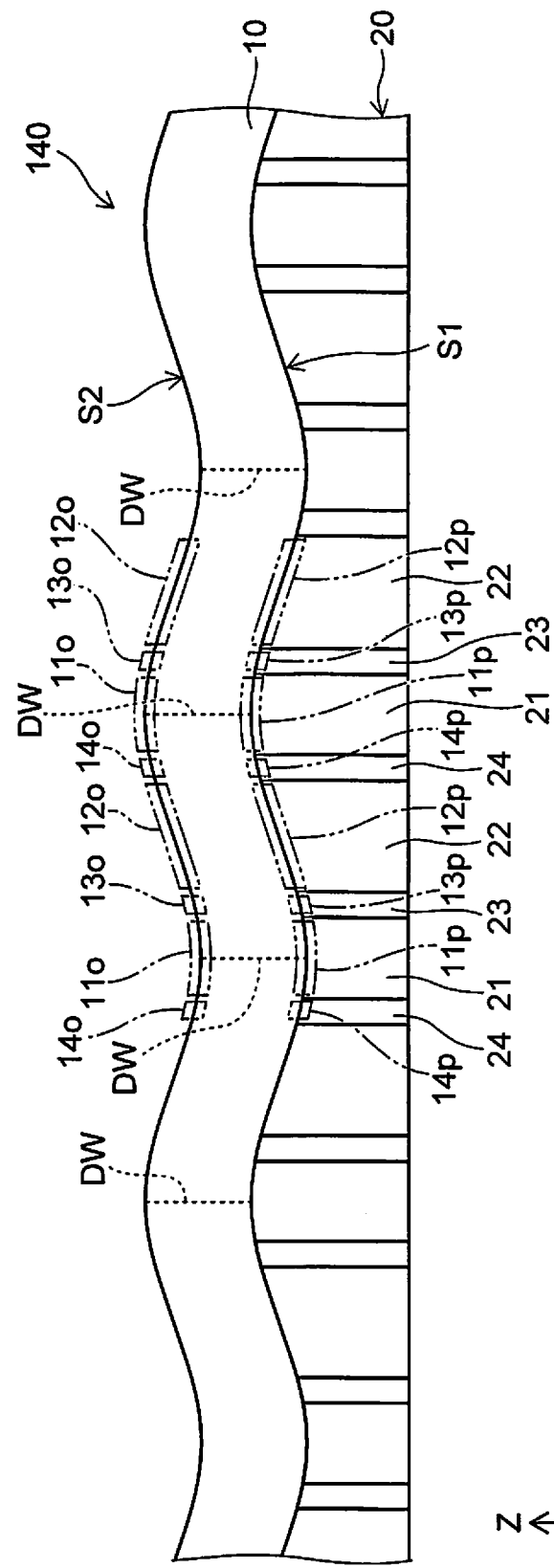
FIG. 4 is a schematic cross-sectional view illustrating another example of the magnetic element according to the first embodiment.

FIG. 4 is a schematic cross-sectional view illustrating another example of the magnetic element according to the first embodiment.

In the magnetic element 140 illustrated in FIG. 4, the first magnetic portion 10 has a first surface S1 and a second surface S2. The first surface S1 is positioned between the second surface S2 and the first member 20 in the Z-axis direction.

The first surface S1 includes a first portion 11p, a second portion 12p, a third portion 13p, and a fourth portion 14p. The direction from the first region 21 toward the first portion 11p is aligned with the Z-axis direction. The direction from the second region 22 toward the second portion 12p is aligned with the Z-axis direction. The direction from the third region 23 toward the third portion 13p is aligned with the Z-axis direction. The direction from the fourth region 24 toward the fourth portion 14p is aligned with the Z-axis direction.

The position along the X-axis direction of the third portion 13p is between the position along the X-axis direction of the first portion 11p and the position along the X-axis direction of the second portion 12p. The position along the X-axis direction of the second portion 12p is between the position along the X-axis direction of the third portion 13p and the position along the X-axis direction of the fourth portion 14p.

The position along the Z-axis direction of the third portion 13p and the position along the Z-axis direction of the fourth portion 14p are between the position along the Z-axis direction of the first portion 11p and the position along the Z-axis direction of the second portion 12p.

The first portion 11p, the second portion 12p, the third portion 13p, and the fourth portion 14p are multiply provided in the X-axis direction.

The position along the X-axis direction of one of the multiple second portions 12p, the position along the X-axis direction of one of the multiple third portions 13p, and the position along the X-axis direction of one of the multiple fourth portions 14p are between the position along the X-axis direction of one of the multiple first portions 11p and the position along the X-axis direction of another one of the multiple first portions 11p.

The position along the Z-axis direction of one of the multiple second portions 12p, the position along the Z-axis direction of one of the multiple third portions 13p, and the position along the Z-axis direction of one of the multiple fourth portions 14p are between the position along the Z-axis direction of one of the multiple first portions 11p and the position along the Z-axis direction of another one of the multiple first portions 11p.

In other words, the first surface S1 includes multiple first top portions and multiple first bottom portions arranged alternately along the X-axis direction. The position along the Z-axis direction of the first top portion is different from the position along the Z-axis direction of the first bottom portion. The first top portion corresponds to one of the multiple first portions 11p. The first bottom portion corresponds to another one of the multiple first portions 11p. The position along the Z-axis direction of the first surface S1 repeatedly changes along the X-axis direction.

For example, the first member 20 includes the multiple first concentration regions and the multiple second concentration regions arranged alternately along the X-axis direction. The concentration of the first element in the first concentration region is higher than the concentration of the first element in the second concentration region. A portion of the multiple first concentration regions corresponds to the first regions 21. Another portion of the multiple first concentration regions corresponds to the second regions 22. A portion of the multiple second concentration regions corresponds to the third regions 23. Another portion of the multiple second concentration regions corresponds to the fourth regions 24. The direction from one of the multiple first concentration regions toward one of the multiple first top portions is aligned with the Z-axis direction. The direction from another one of the multiple first concentration regions toward one of the multiple first bottom portions is aligned with the Z-axis direction.

The second surface S2 includes a first opposing portion 11o, a second opposing portion 12o, a third opposing portion 13o, and a fourth opposing portion 14o. The direction from the first region 21 toward the first opposing portion 11o is aligned with the Z-axis direction. The direction from the second region 22 toward the second opposing portion 12o is aligned with the Z-axis direction. The direction from the third region 23 toward the third opposing portion 13o is aligned with the Z-axis direction. The direction from the fourth region 24 toward the fourth opposing portion 14o is aligned with the Z-axis direction.

The position along the X-axis direction of the third opposing portion 13o is between the position along the X-axis direction of the first opposing portion 11o and the position along the X-axis direction of the second opposing portion 12o. The position along the X-axis direction of the second opposing portion 12o is between the position along the X-axis direction of the third opposing portion 13o and the position along the X-axis direction of the fourth opposing portion 14o.

The position along the Z-axis direction of the third opposing portion 13o and the position along the Z-axis direction of the fourth opposing portion 14o are between the position along the Z-axis direction of the first opposing portion 11o and the position along the Z-axis direction of the second opposing portion 12o.

The first opposing portion 11o, the second opposing portion 12o, the third opposing portion 13o, and the fourth opposing portion 14o are multiply provided in the X-axis direction.

The position along the X-axis direction of one of the multiple second opposing portions 12o, the position along the X-axis direction of one of the multiple third opposing portions 13o, and the position along the X-axis direction of one of the multiple fourth opposing portions 14o are between the position along the X-axis direction of one of the multiple first opposing portions 110 and the position along the X-axis direction of another one of the multiple first opposing portions 110.

The position along the Z-axis direction of one of the multiple second opposing portions 12o, the position along the Z-axis direction of one of the multiple third opposing portions 13o, and the position along the Z-axis direction of one of the multiple fourth opposing portions 140 are between the position along the Z-axis direction of one of the multiple first opposing portions 110 and the position along the Z-axis direction of another one of the multiple first opposing portions 110.

In other words, the second surface S2 includes multiple second top portions and multiple second bottom portions arranged alternately along the X-axis direction. The position along the Z-axis direction of the second top portion is different from the position along the Z-axis direction of the second bottom portion. The second top portion corresponds to one of the multiple first opposing portions 110. The second bottom portion corresponds to another one of the multiple first opposing portions 11o. The position along the Z-axis direction of the second surface S2 repeatedly changes along the X-axis direction. For example, the direction from one of the multiple first concentration regions toward one of the multiple second top portions is aligned with the Z-axis direction. The direction from another one of the multiple first concentration regions toward one of the multiple second bottom portions is aligned with the Z-axis direction.

The position along the Z-axis direction of the first opposing portion 110 and the position along the Z-axis direction of the second portion 12p are between the position along the Z-axis direction of the first portion 11p and the position along the Z-axis direction of the second opposing portion 12o. The distance along the Z-axis direction between the first surface S1 and the second surface S2 is, for example, constant in the X-axis direction.

FIG. 5A is a schematic cross-sectional view illustrating another example of the magnetic element according to the first embodiment. FIG. 5B is a schematic plan view illustrating the example of the magnetic element according to the first embodiment.

In the magnetic element 150 as illustrated in FIG. 5B, the direction from the first surface S1 toward the second surface S2 is aligned with the Y-axis direction.

The position along the Y-axis direction of the third portion 13p and the position along the Y-axis direction of the fourth portion 14p are between the position along the Y-axis direction of the first portion 11p and the position along the Y-axis direction of the second portion 12p. The position along the Y-axis direction of the first surface S1 repeatedly changes along the X-axis direction.

The position along the Y-axis direction of the third opposing portion 13o and the position along the Y-axis direction of the fourth opposing portion 14o are between the position along the Y-axis direction of the first opposing portion 110 and the position along the Y-axis direction of the second opposing portion 12o. The position along the Y-axis direction of the second surface S2 repeatedly changes along the X-axis direction.

The direction from the first portion 11p toward the first opposing portion 110 is aligned with the Y-axis direction. The direction from the second portion 12p toward the second opposing portion 12o is aligned with the Y-axis direction. The direction from the third portion 13p toward the third opposing portion 13o is aligned with the Y-axis direction. The direction from the fourth portion 14p toward the fourth opposing portion 14o is aligned with the Y-axis direction.

The position along the Y-axis direction of the first opposing portion 110 and the position along the Y-axis direction of the second portion 12p are between the position along the Y-axis direction of the first portion 11p and the position along the Y-axis direction of the second opposing portion 12o. The distance along the Y-axis direction between the first surface S1 and the second surface S2 is, for example, constant in the X-axis direction. As illustrated in FIG. 5A, the length in the Z-axis direction of the first surface S1 is, for example, constant in the X-axis direction. The length in the Z-axis direction of the second surface S2 is, for example, constant in the X-axis direction.

Figure 6:
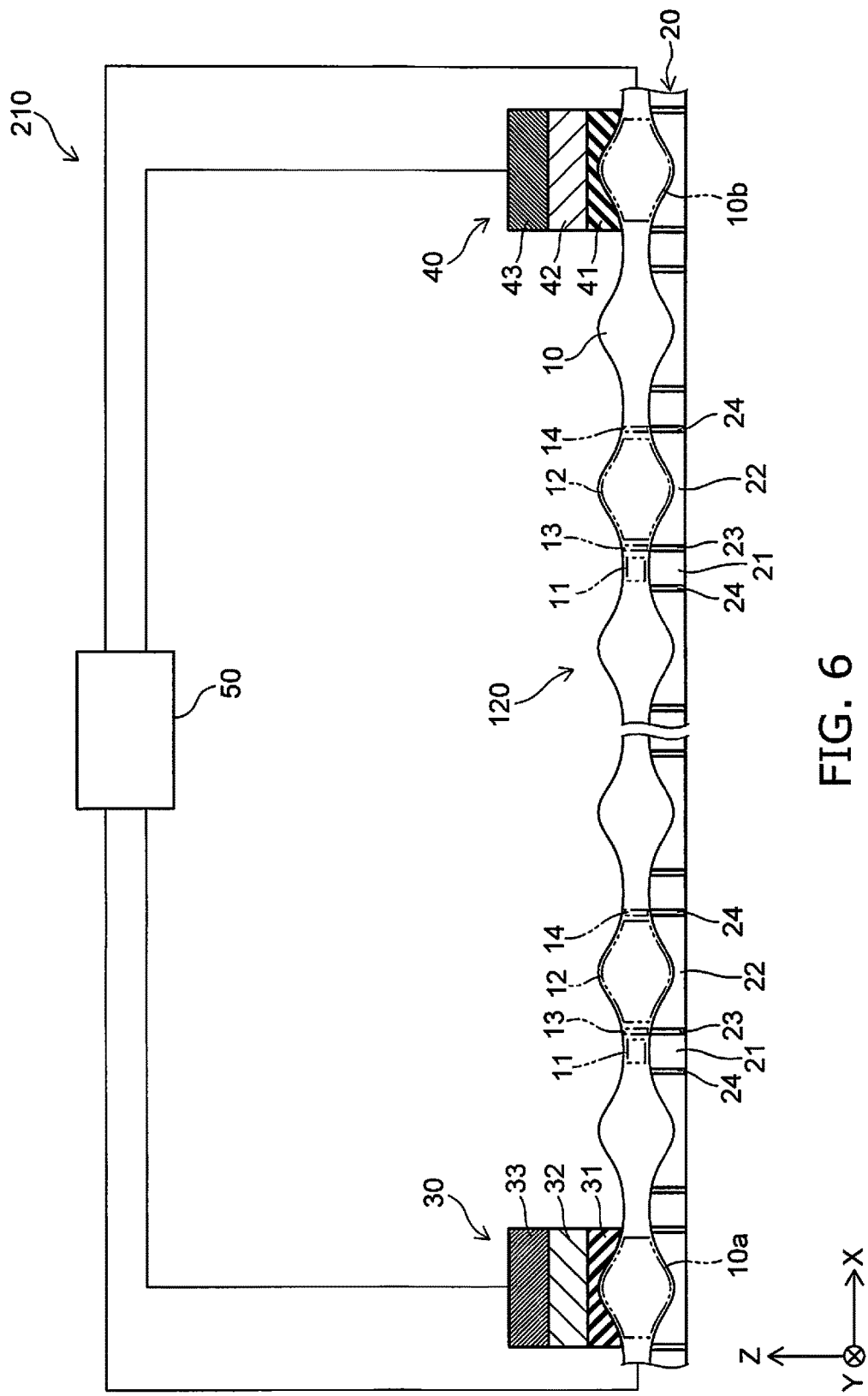
FIG. 6 is a schematic cross-sectional view illustrating an example of a magnetic memory device according to a second embodiment.

FIG. 6 is a schematic cross-sectional view illustrating an example of a magnetic memory device according to a second embodiment.

As illustrated in FIG. 6, the magnetic memory device 210 includes, for example, the magnetic element 120, a read portion 30, a write portion 40, and a controller 50.

The first magnetic portion 10 includes a first connection region 10a and a second connection region 10b. The first region 21, the second region 22, the third region 23, and the fourth region 24 are positioned between the first connection region 10a and the second connection region 10b in the X-axis direction.

For example, the read portion 30 is connected to the first connection region 10a. The write portion 40 is connected to the second connection region 10b. The write portion 40 is separated from the read portion 30 in the X-axis direction.

The read portion 30 includes a first nonmagnetic portion 31, a second magnetic portion 32, and a first electrode 33. The first nonmagnetic portion 31 is provided between the first connection region 10a and the second magnetic portion 32. The second magnetic portion 32 is provided between the first nonmagnetic portion 31 and the first electrode 33.

The write portion 40 includes a second nonmagnetic portion 41, a third magnetic portion 42, and a second electrode 43. The second nonmagnetic portion 41 is provided between the second connection region 10b and the third magnetic portion 42. The third magnetic portion 42 is provided between the second nonmagnetic portion 41 and the second electrode 43.

The controller is electrically connected to the first connection region 10a, the second connection region 10b, the first electrode 33, and the second electrode 43.

When reading the magnetization information stored in the first magnetic portion 10, for example, the controller 50 causes a current to flow between the first electrode 33 and the first connection region 10a. In the case where the orientation of the magnetization of the magnetic domain positioned at the first connection region 10a is the same as (parallel to) the orientation of the magnetization of the second magnetic portion 32, the electrical resistance value between the first connection region 10a and the second magnetic portion 32 is relatively small. In the case where the orientation of the magnetization of the magnetic domain positioned at the first connection region 10a is the reverse of (antiparallel to) the orientation of the magnetization of the second magnetic portion 32, the electrical resistance value between the first connection region 10a and the second magnetic portion 32 is relatively large. By reading the change of the electrical resistance value, the read portion 30 reads the magnetization information of the magnetic domain positioned at the first connection region 10a.

When writing information to the first magnetic portion 10, for example, the controller 50 causes a current to flow from the second connection region 10b toward the second electrode 43. When the electrons flow from the third magnetic portion 42 toward the second connection region 10b, a spin-polarized electron current that has the orientation of the magnetization of the third magnetic portion 42 flows. By the spin-polarized electron current, the orientation of the magnetization of the magnetic domain positioned at the second connection region 10b is controlled; and the magnetization information is written. The second magnetic portion 32 and the third magnetic portion 42 include, for example, magnetic materials similar to those of the first magnetic portion 10 described above.

The first nonmagnetic portion 31 and the second nonmagnetic portion 41 include a nonmagnetic metal material or a nonmagnetic insulating material. The nonmagnetic metal material is, for example, at least one selected from the group consisting of Au, Cu, Cr, Zn, Ga, Nb, Mo, Ru, Pd, Ag, Hf, Ta, W, Pt, and Bi.

The first nonmagnetic portion 31 and the second nonmagnetic portion 41 include at least one selected from the group consisting of $Al_2O_3$, $SiO_2$, MgO, AlN, $Bi_2O_3$, $MgF_2$, $CaF_2$, $SrTiO_3$, $AlLaO_3$, Al—N—O, Si—N—O, and a nonmagnetic semiconductor. In such a case, the first nonmagnetic portion 31 and the second nonmagnetic portion 41 function as, for example, tunneling barrier layers. Thereby, the magnetoresistance effect of the read portion 30 and the write portion 40 can be large. The nonmagnetic semiconductor is, for example, at least one selected from the group consisting of ZnO, InMn, GaN, GaAs, $TiO_2$, Zn, and Te.

It is unnecessary for the compounds described above to have perfectly precise stoichiometric compositions; and a deficiency or excess of oxygen, nitrogen, fluorine, or the like may exist.

It is desirable for the thickness of the first nonmagnetic portion 31 and the thickness of the second nonmagnetic portion 41 each to be, for example, not less than 0.2 nm and not more than 20 nm. In the case where the first nonmagnetic portion 31 and the second nonmagnetic portion 41 include an insulating material, it is desirable for the thickness of the first nonmagnetic portion 31 and the thickness of the second nonmagnetic portion 41 each to be not less than 0.2 nm and not more than 5 nm. In the case where the first nonmagnetic portion 31 and the second nonmagnetic portion 41 include an insulating material, pinholes may exist in the interiors of these layers.

The first electrode 33 and the second electrode 43 include, for example, at least one metal selected from the group consisting of Al and Cu.

An antiferromagnetic portion may be provided between the second magnetic portion 32 and the first electrode 33 and between the third magnetic portion 42 and the second electrode 43. The antiferromagnetic portion includes an antiferromagnetic material. The antiferromagnetic material is, for example, at least one selected from the group consisting of Fe—Mn, Pt—Mn, Pt—Cr—Mn, Ni—Mn, Pd—Mn, Pd—Pt—Mn, Ir—Mn, Pt—Ir—Mn, NiO, $Fe_2O_3$, and a magnetic semiconductor.

Figure 7A:
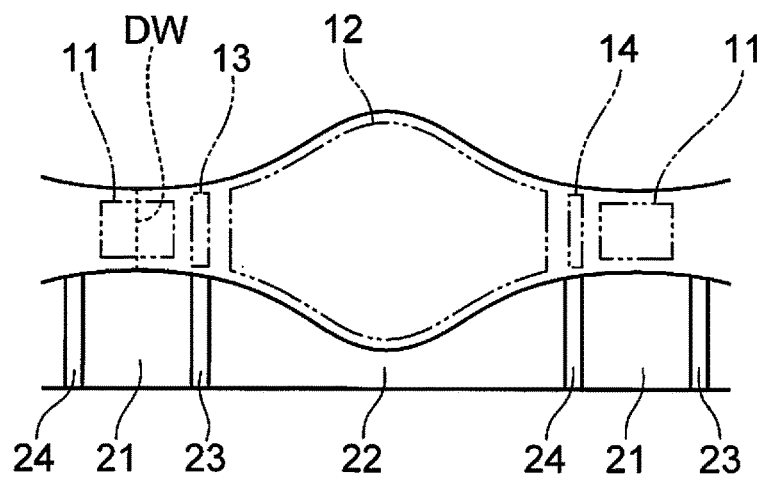
FIG. 7A to FIG. 7C are cross-sectional views illustrating an example of operations of the magnetic memory device according to the second embodiment.
Figure 7B:
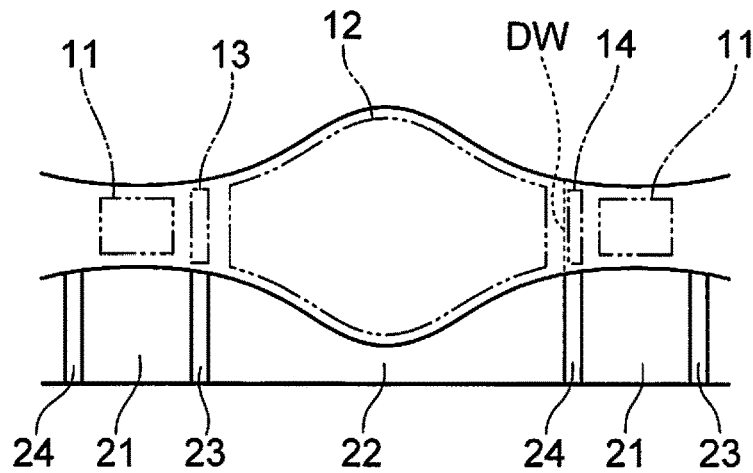
Figure 7C:
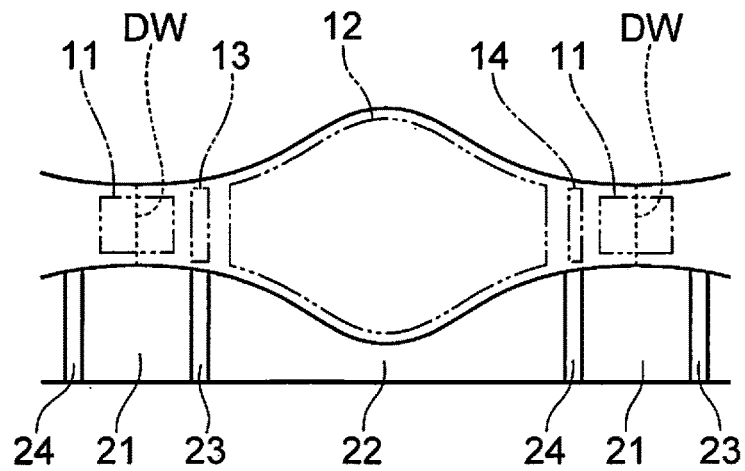

FIG. 7A to FIG. 7C are cross-sectional views illustrating an example of operations of the magnetic memory device according to the second embodiment.

Figure 8:
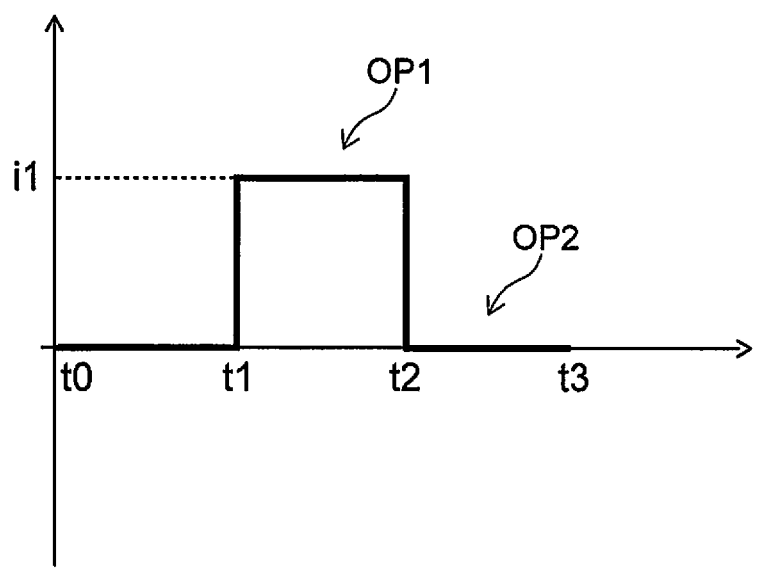
FIG. 8 is a graph illustrating an example of the relationship between time and the orientation of the current supplied to the first magnetic portion.

FIG. 8 is a graph illustrating an example of the relationship between time and the orientation of the current supplied to the first magnetic portion.

In FIG. 8, the horizontal axis is the time; and the vertical axis is the current value. In FIG. 8, the current that flows from the second connection region 10b toward the first connection region 10a is illustrated as being positive. In other words, in FIG. 8, a current that flows from the right side to the left side in FIG. 7A to FIG. 7C is illustrated as being positive.

FIG. 7A illustrates a state between a time t0 and a time t1 illustrated in FIG. 8. The domain wall DW exists at the first magnetic region 11 when the current is not supplied to the first magnetic portion 10.

The controller 50 performs a first operation OP1 between the time t1 and a time t2. FIG. 7B illustrates the state at the time t2 illustrated in FIG. 8. In the first operation OP1, a first current is supplied to the first magnetic portion 10 in the left direction of FIG. 7B. In other words, in the first operation OP1, electrons flow in the right direction of FIG. 7B. When the first operation OP1 is performed, the domain wall DW moves along the flow of the electrons. The domain wall DW passes from the first magnetic region 11 through the third magnetic region 13 and the second magnetic region 12 and stops at the boundary between the second magnetic region 12 and the fourth magnetic region 14.

The controller 50 performs a second operation OP2 between the time t2 and a time t3. In the second operation OP2, the controller 50 stops the supply of the first current to the first magnetic portion 10. FIG. 7C illustrates the state at the time t3 illustrated in FIG. 8. Between the time t2 and the time t3, the domain wall DW that existed at the boundary between the third magnetic region 13 and the fourth magnetic region 14 moves to the first magnetic region 11 that is energetically stable in the state in which the current is not supplied.

In the second operation OP2, the controller 50 may supply a second current to the first magnetic portion 10. The absolute value of the current value of the second current in the second operation OP2 is set to be less than the absolute value of a current value ii of the first current in the first operation OP1. The absolute value of the current value of the second current Is set to be in a range such that the domain wall DW is movable from the boundary between the second magnetic region 12 and the fourth magnetic region 14 to the first magnetic region 11.

In the case where a current is caused to flow in the state in which the domain wall DW is between the second magnetic region 12 and the fourth magnetic region 14, there is a possibility that the orientation of the movement of the domain wall DW may not be stable. In the magnetic memory device 210 according to the embodiment, the domain wall DW moves from the boundary between the second magnetic region 12 and the fourth magnetic region 14 to the first magnetic region 11 after the domain wall DW is moved by the first current.

Therefore, the orientation of the movement of the domain wall DW when the current is caused to flow in the first magnetic portion 10 can be stable.

The inventors discovered that in the magnetic memory device 210, the domain wall DW that has moved from the first magnetic region 11 can be stopped at the boundary between the second magnetic region 12 and the fourth magnetic region 14. The movement of the domain wall DW from the first magnetic region 11 to the boundary between the second magnetic region 12 and the fourth magnetic region 14 is independent of the supply time of the first current.

For example, in the case where the first current is supplied to the first magnetic portion 10 for a first time, the domain wall DW moves from the first magnetic region 11 to the boundary between the second magnetic region 12 and the fourth magnetic region 14. For example, in the case where the first current is supplied to the first magnetic portion 10 for a second time that is 2 times the first time, the domain wall DW moves from the first magnetic region 11 to the boundary between the second magnetic region 12 and the fourth magnetic region 14. The domain wall DW can be moved one bit length independent of the supply time of the first current. Accordingly, according to the embodiment, the controllability of the position of the domain wall DW is improved; and it is possible to improve the operational stability of the magnetic memory device.

The inventors consider that there is a possibility that the stop of the domain wall DW has a relationship with the spin Hall effect and the Dzyaloshinskii-Moriya Interaction (DMI) of the first member 20.

Based on this consideration, it is considered that the product $\theta D$ of a spin Hall angle $\theta$ and a coefficient D of the DMI is a positive value for the first region 21 and the second region 22 in the example illustrated in FIG. 7A to FIG. 7C and FIG. 8. It is considered that the product $\theta D$ of the spin Hall angle and the coefficient D of the DMI is a negative value for the third region 23 and the fourth region 24. Or, it is considered that the absolute value of the product $\theta D$ for the third region 23 and the fourth region 24 is less than the absolute value of the product $\theta D$ for the first region 21 and the second region 22. In these cases, it is considered that the domain wall DW moves along the orientation in which the electrons flow.

For example, it is considered that the domain wall DW moves to the boundary between the second magnetic region 12 and the fourth magnetic region 14 due to the spin Hall effect generated from each region of the first member 20. The spin Hall effect that acts on the domain wall DW decreases as the movement distance of the domain wall DW lengthens. It is considered that this affects the passage of the domain wall DW through the third magnetic region 13 and the stopping of the domain wall DW at the boundary between the second magnetic region 12 and the fourth magnetic region 14.

The first region 21, the second region 22, the third region 23, and the fourth region 24 include the first element. The first element is, for example, at least one selected from the group consisting of Au, Ir, Al, Ta, TaN, W, Hf, Pt, and Pd. The concentration of the first element in the first region 21 is higher than the concentration of the first element in the third region 23 and higher than the concentration of the first element in the fourth region 24. The concentration of the first element in the second region 22 is higher than the concentration of the first element in the third region 23 and higher than the concentration of the first element in the fourth region 24.

Thereby, it is considered that the absolute value of $\theta D$ of the first region 21 and the second region 22 can be greater than the absolute value of $\theta D$ of the third region 23 and the fourth region 24.

The first region 21 and the second region 22 may include the first element; and the third region 23 and the fourth region 24 may not include the first element. In such a case, it is considered that $\theta D$ of the first region 21 and the second region 22 can be set to a positive value; and $\theta D$ of the third region 23 and the fourth region 24 can be set to a negative value. Or, it is considered that the absolute value of $\theta D$ of the first region 21 and the second region 22 can be set to be greater than the absolute value of $\theta D$ of the third region 23 and the fourth region 24.

Or, the first element may be selected from a first group consisting of Au, Ir, Al, Ta, and Hf. In such a case, the first region 21 includes the first element; and the second region 22 includes a second element. The second element is at least one selected from the first group. The second element may be different from the first element.

The third region 23 includes a third element; and the fourth region 24 includes a fourth element. The third element is at least one selected from a second group consisting of W, Pt, Pd, and TaN. The fourth element is at least one selected from the second group. The third element may be the same as the fourth element or may be different from the fourth element.

In such a case, it is considered that $\theta D$ of the first region 21 and the second region 22 can be set to be a positive value; and $\theta D$ of the third region 23 and the fourth region 24 can be set to be a negative value.

$\theta D$ of the first region 21 and the second region 22 may be a negative value; and $\theta D$ of the third region 23 and the fourth region 24 may be a positive value. In such a case, it is considered that the domain wall DW moves along the reverse orientation of the orientation in which the electrons flow.

In such a case, the third region 23 includes the first element; and the fourth region 24 includes the second element. The first element is at least one selected from the first group consisting of Au, Ir, Al, Ta, and Hf. The second element is at least one selected from the first group. The second element may be different from the first element.

The first region 21 includes the third element; and the second region 22 includes the fourth element. The third element is at least one selected from the second group consisting of W, Pt, Pd, and TaN. The fourth element is at least one selected from the second group. The third element may be the same as the fourth element or may be different from the fourth element.

In such a case, it is considered that $\theta D$ of the first region 21 and the second region 22 can be set to be a negative value; and $\theta D$ of the third region 23 and the fourth region 24 is set to be a positive value.

FIG. 9A to FIG. 9C and FIG. 10A to FIG. 10C are simulation results illustrating characteristics of the magnetic memory device according to the second embodiment.

Figure 9:
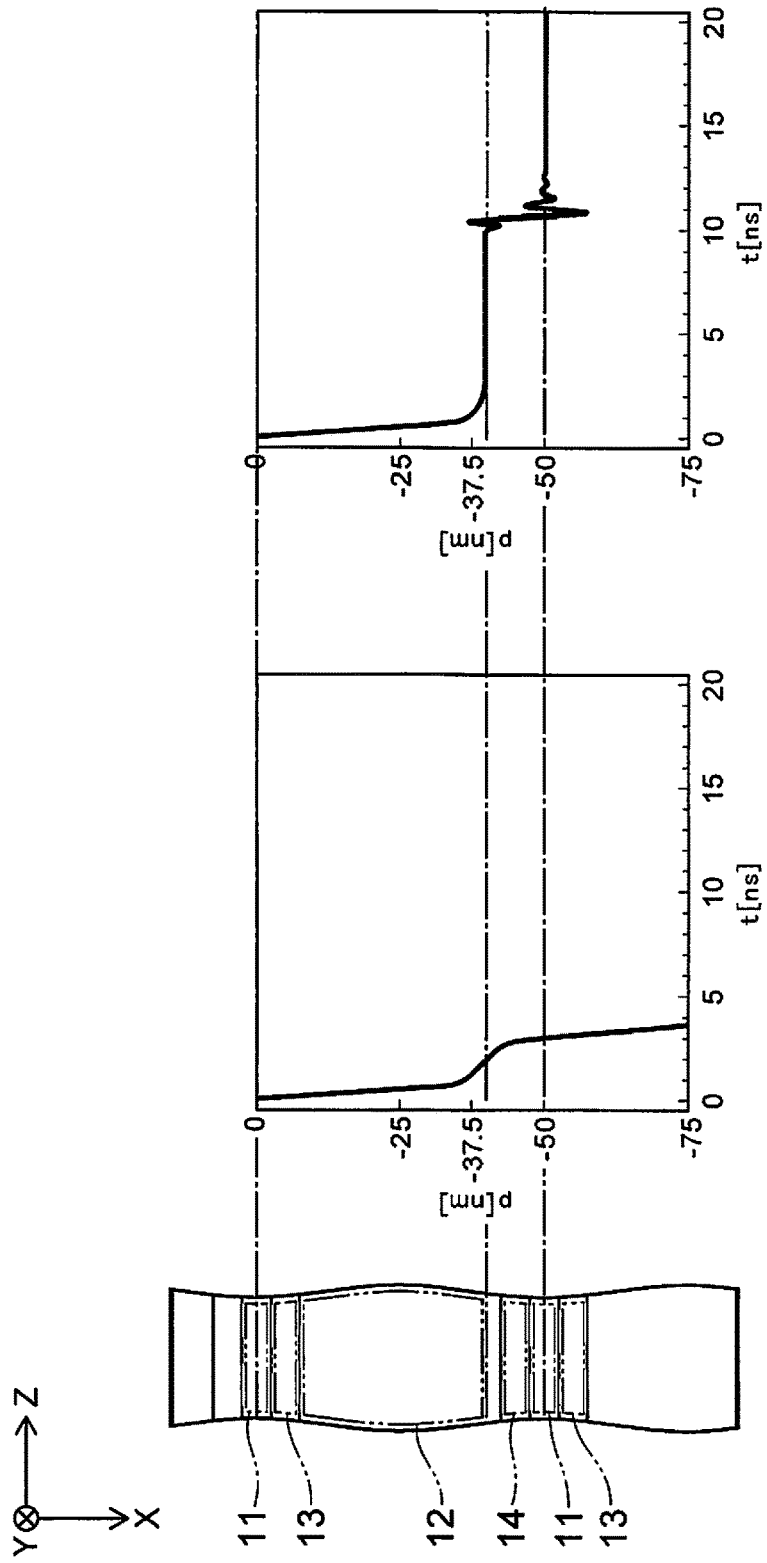
FIG. 9A to FIG. 9C and FIG. 10A to FIG. 10C are simulation results illustrating characteristics of the magnetic memory device according to the second embodiment.
Figure 10:
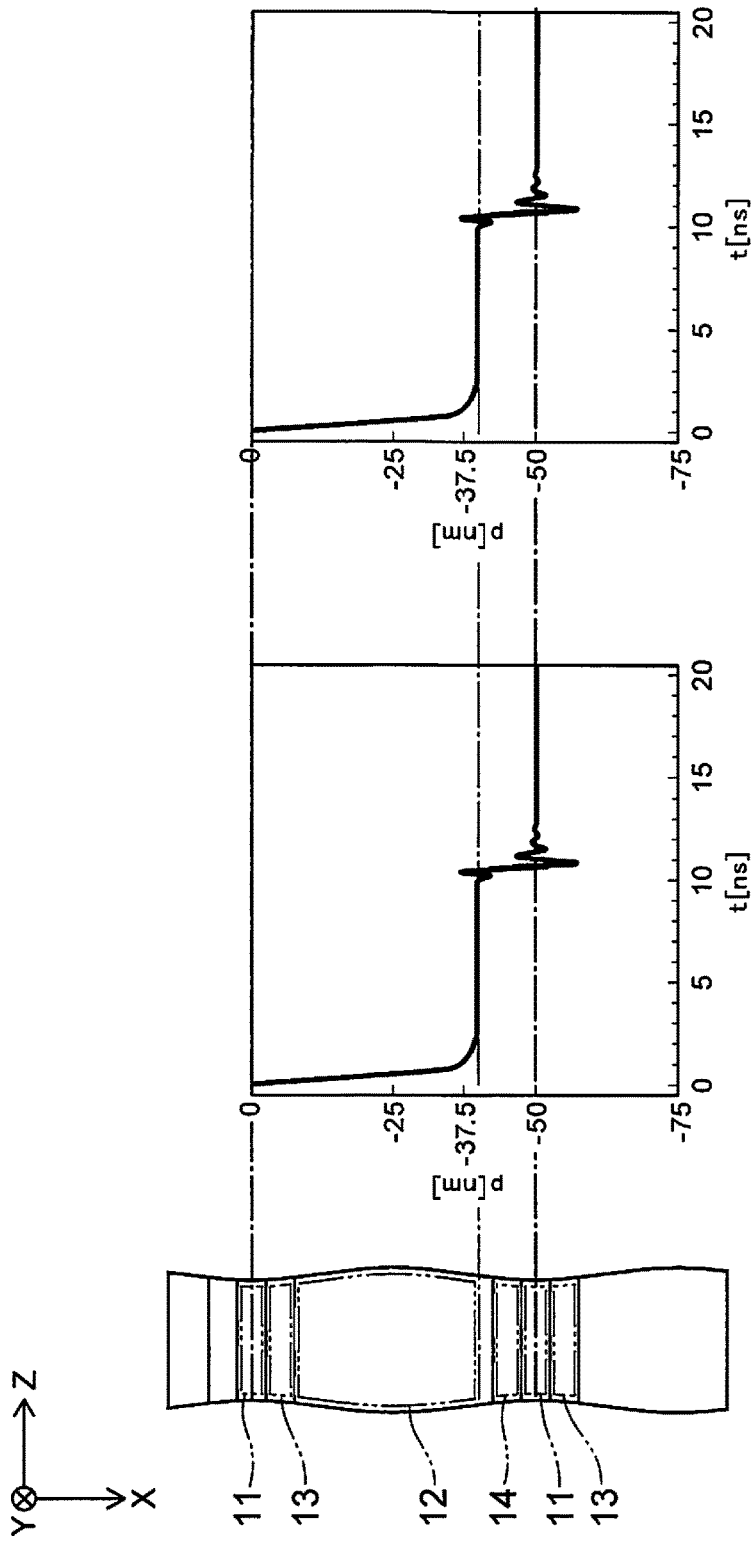

FIG. 9A and FIG. 10A are cross-sectional views illustrating a portion of the magnetic memory device 210 according to the second embodiment. In FIG. 9B, FIG. 9C, FIG. 10B, and FIG. 10C, the horizontal axis is a time t; and the vertical axis is a position p of the domain wall in the X-axis direction. FIG. 9B, FIG. 9C, FIG. 10B, and FIG. 10C illustrate the change of the position of the domain wall DW when the electrons are caused to flow downward from above in the first magnetic portion 10 illustrated in FIG. 9A and FIG. 10A.

In the simulation, the coefficient D of the DMI of the first region 21 and the second region 22 is set to 0.1 erg/cm$^2$. The spin Hall angle $\theta$ is set to 0.9 for the first region 21, the second region 22, the third region 23, and the fourth region 24. FIG. 9B illustrates the results in the case where the coefficient D of the DMI of the third region 23 and the fourth region 24 is 0.1 erg/cm$^2$. FIG. 9C illustrates the results in the case where the coefficient D is 0. FIG. 10B illustrates the results in the case where the coefficient D is −0.05 erg/cm². FIG. 10C illustrates the results in the case where the coefficient D is −0.1 erg/cm².

The results of FIG. 9B illustrate that the domain wall DW does not stop at the boundary between the second magnetic region 12 and the fourth magnetic region 14 in the case where the coefficient D is 0.1 erg/cm². The results of FIG. 9C illustrate that the domain wall DW stops at the boundary between the second magnetic region 12 and the fourth magnetic region 14 in the case where the coefficient D is 0 erg/cm².

The results of FIG. 10B and FIG. 10C illustrate that the domain wall DW stops at the boundary between the second magnetic region 12 and the fourth magnetic region 14 in the case where the coefficient D is −0.05 erg/cm² or −0.1 erg/cm².

The results of FIG. 9B, FIG. 9C, FIG. 10B, and FIG. 10C illustrate that it is desirable for the coefficient D of the DMI of the first region 21 and the second region 22 to be one of a positive value or a negative value, and for the coefficient D of the DMI of the third region 23 and the fourth region 24 to be the other of the positive value or the negative value.

Figure 11:
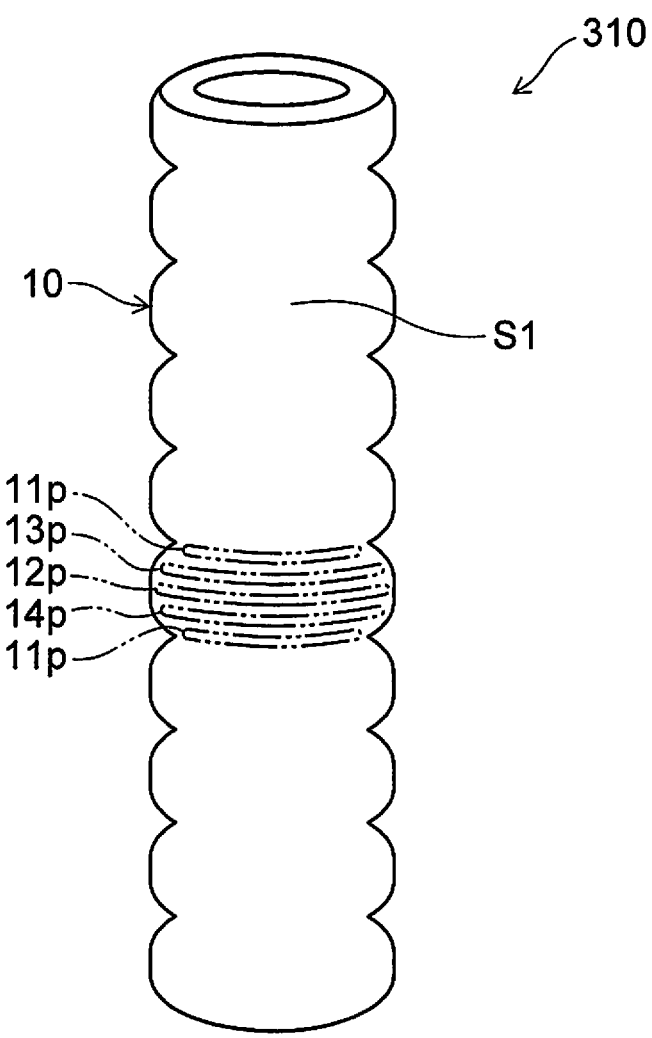
FIG. 11 is a schematic perspective view illustrating a portion of a magnetic element according to a third embodiment.

FIG. 11 is a schematic perspective view illustrating a portion of a magnetic element according to a third embodiment.

Figure 12:
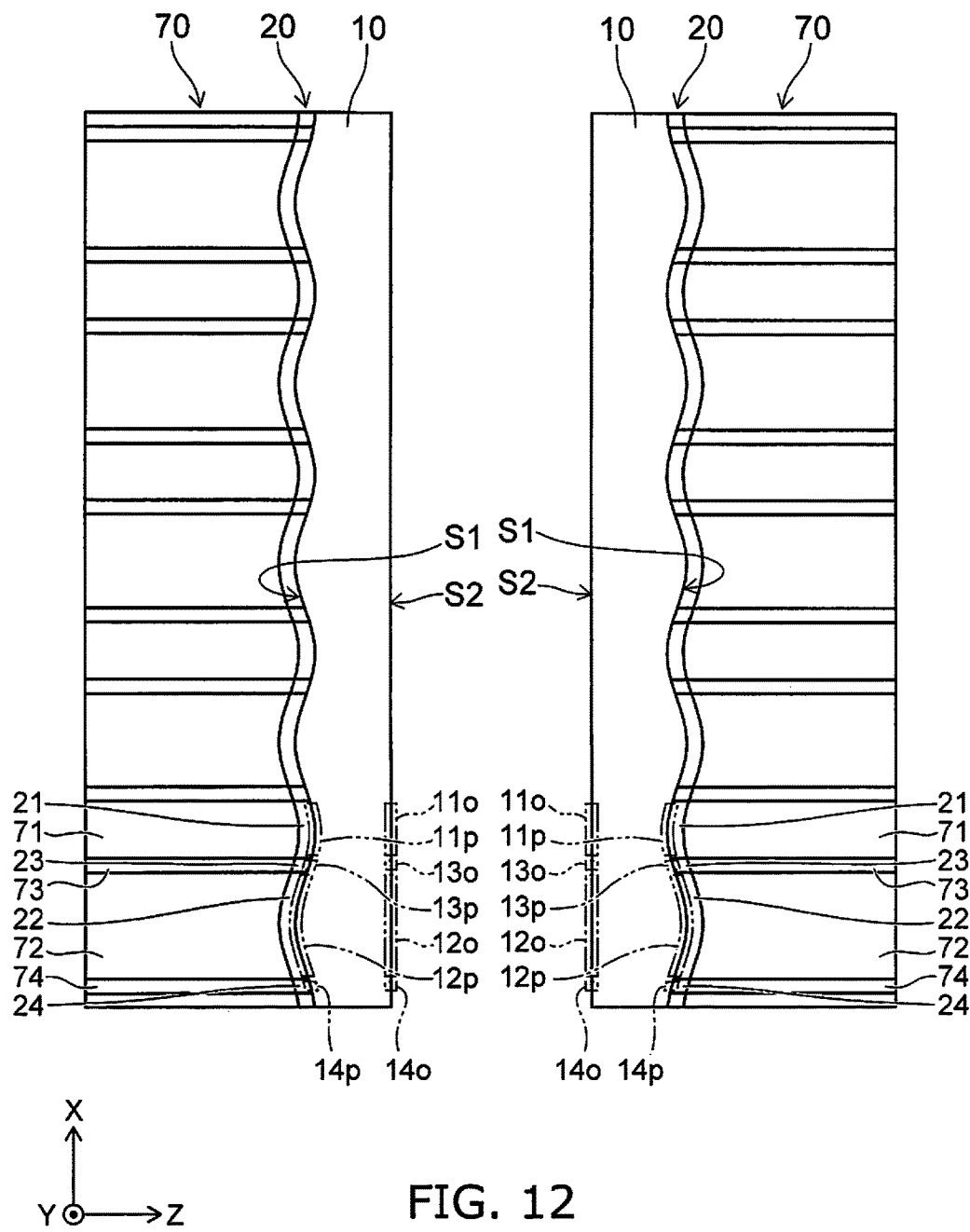
FIG. 12 is a schematic cross-sectional view illustrating a portion of the magnetic element according to the third embodiment.

FIG. 12 is a schematic cross-sectional view illustrating a portion of the magnetic element according to the third embodiment.

As illustrated in FIG. 11, the first magnetic portion 10 has a tubular configuration in the magnetic element 310. The first magnetic portion 10 extends in the X-axis direction.

As illustrated in FIG. 12, the first member 20 is provided around the first magnetic portion 10. The first member 20 extends in the X-axis direction. The direction from the first member 20 toward the first magnetic portion 10 crosses the X-axis direction. The first magnetic portion 10 has the first surface S1 and the second surface S2. The first surface S1 is positioned between the second surface S2 and the first member 20 in the Y-axis direction and the Z-axis direction.

The first surface S1 includes the first portion 11p, the second portion 12p, the third portion 13p, and the fourth portion 14p. The second surface S2 includes the first opposing portion 11o, the second opposing portion 12o, the third opposing portion 13o, and the fourth opposing portion 14o.

The first region 21 is provided around the first opposing portion 11o. The first portion 11p is positioned between the first opposing portion 11o and the first region 21 in a direction crossing the X-axis direction. The second region 22 is provided around the second opposing portion 12o. The second portion 12p is positioned between the second opposing portion 12o and the second region 22 in a direction crossing the X-axis direction.

The third region 23 is provided around the third opposing portion 13o. The third portion 13p is positioned between the third opposing portion 13o and the third region 23 in a direction crossing the X-axis direction. The fourth region 24 is provided around the fourth opposing portion 14o. The fourth portion 14p is positioned between the fourth opposing portion 14o and the fourth region 24 in a direction crossing the X-axis direction.

The magnetic element 310 further includes a first insulating portion 70. The first member 20 is positioned between the first magnetic portion 10 and the first insulating portion 70 in a direction crossing the X-axis direction. The first insulating portion 70 includes a first insulating region 71, a second insulating region 72, a third insulating region 73, and a fourth insulating region 74.

The first insulating region 71 is provided around the first region 21. The first region 21 is positioned between the first portion 11p and the first insulating region 71 in a direction crossing the X-axis direction. The second insulating region 72 is provided around the second region 22. The second region 22 is positioned between the second portion 12p and the second insulating region 72 in a direction crossing the X-axis direction.

The third insulating region 73 is provided around the third region 23. The third region 23 is positioned between the third portion 13p and the third insulating region 73 in a direction crossing the X-axis direction. The fourth insulating region 74 is provided around the fourth region 24. The fourth region 24 is positioned between the fourth portion 14p and the fourth insulating region 74 in a direction crossing the X-axis direction.

The distance along a direction crossing the X-axis direction between the first portion 11p and the first opposing portion 11o is shorter than the distance along a direction crossing the X-axis direction between the third portion 13p and the third opposing portion 13o and shorter than the distance along a direction crossing the X-axis direction between the fourth portion 14p and the fourth opposing portion 14o.

The distance along a direction crossing the X-axis direction between the second portion 12p and the second opposing portion 12o is longer than the distance along a direction crossing the X-axis direction between the third portion 13p and the third opposing portion 13o and longer than the distance along a direction crossing the X-axis direction between the fourth portion 14p and the fourth opposing portion 14o.

The cross-sectional area along the Y-Z plane of the first magnetic portion 10 repeatedly changes along the X-axis direction.

The first insulating region 71, the second insulating region 72, the third insulating region 73, and the fourth insulating region 74 include, for example, an insulating material such as silicon oxide, silicon nitride, etc. The first insulating region 71 and the second insulating region 72 include, for example, at least one first element selected from the group consisting of Au, Ir, Al, Ta, TaN, W, Hf, Pt, and Pd.

The concentration of the first element in the third insulating region 73 is lower than the concentration of the first element in the first insulating region 71 and lower than the concentration of the second element in the second insulating region 72. The concentration of the first element in the fourth insulating region 74 is lower than the concentration of the first element in the first insulating region 71 and lower than the concentration of the second element in the second insulating region 72. The third insulating region 73 and the fourth insulating region 74 do not include the first element.

In such a case, the concentration of the first element in the third region 23 is lower than the concentration of the first element in the first region 21 and lower than the concentration of the first element in the second region 22. The concentration of the first element in the fourth region 24 is lower than the concentration of the first element in the first region 21 and lower than the concentration of the second element in the second region 22. The third region 23 and the fourth region 24 do not include the first element. Thereby, it is considered that the absolute value of θD of the first region 21 and the second region 22 can be set to be larger than the absolute value of θD of the third region 23 and the fourth region 24.

Or, the first insulating region 71 includes the first element; and the second insulating region 72 includes the second element. The first element is at least one selected from the first group consisting of Au, Ir, Al, Ta, and Hf. The second element is at least one selected from the first group. The second element may be different from the first element.

The third insulating region 73 includes the third element. The fourth insulating region 74 includes the fourth element. The third element is at least one selected from the second group consisting of W, Pt, Pd, and TaN. The fourth element is at least one selected from the second group. The third element may be the same as the fourth element or may be different from the fourth element.

In such a case, the first region 21 includes the first element; and the second region 22 includes the second element. The third region 23 includes the third element; and the fourth region 24 includes the fourth element. Thereby, it is considered that θD of the first region 21 and the second region 22 can be set to be a positive value; and θD of the third region 23 and the fourth region 24 can be set to be a negative value.

Or, the third insulating region 73 includes the first element; and the fourth insulating region 74 includes the second element. The first element is at least one selected from the first group consisting of Au, Ir, Al, Ta, and Hf. The second element is at least one selected from the first group. The second element may be different from the first element.

The first insulating region 71 includes the third element; and the second insulating region 72 includes the fourth element. The third element is at least one selected from the second group consisting of W, Pt, Pd, and TaN. The fourth element is at least one selected from the second group. The third element may be the same as the fourth element or may be different from the fourth element.

In such a case, the third region 23 includes the first element; and the fourth region 24 includes the second element. The first region 21 includes the third element; and the second region 22 includes the fourth element. Thereby, it is considered that θD of the first region 21 and the second region 22 can be set to be a negative value; and θD of the third region 23 and the fourth region 24 can be set to be a positive value.

FIG. 13A to FIG. 13D are schematic cross-sectional views illustrating a portion of a method for manufacturing the magnetic element according to the third embodiment.

The method for forming the first magnetic portion 10, the first member, and the first insulating portion 70 will now be described.

Figures 13A, 13B:
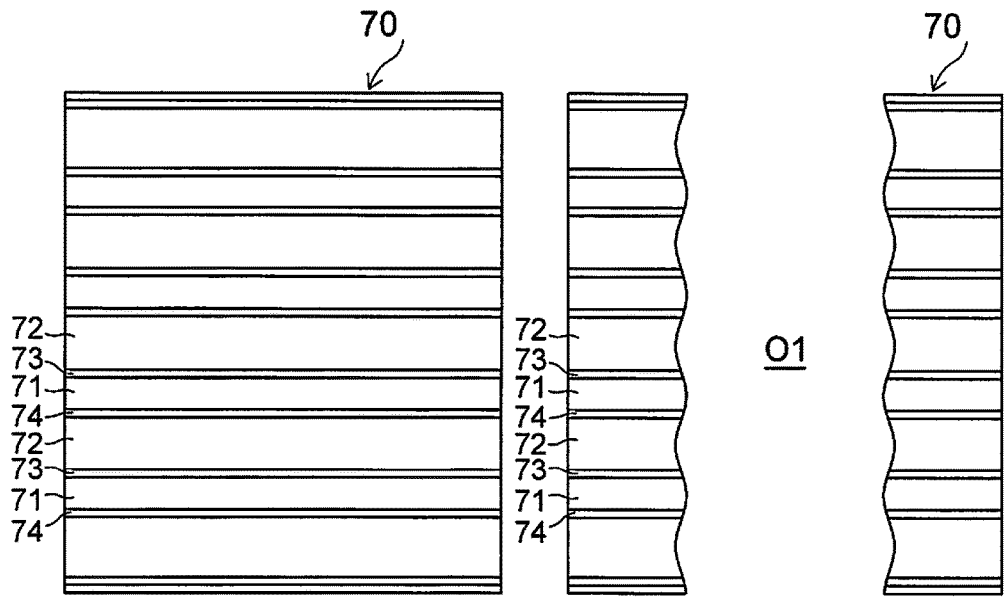
FIG. 13A to FIG. 13D are schematic cross-sectional views illustrating a portion of a method for manufacturing the magnetic element according to the third embodiment.

As illustrated in FIG. 13A, the first insulating portion 70 is formed by stacking the first insulating region 71, the second insulating region 72, the third insulating region 73, and the fourth insulating region 74. For example, at least one first element selected from the group consisting of Au, Ir, Al, Ta, TaN, W, Hf, Pt, and Pd is added to these insulating regions only when forming the first insulating region 71 and the second insulating region 72.

As illustrated in FIG. 13B, a first opening O1 is formed in the first insulating portion 70. The first opening O1 includes multiple large diameter portions and multiple small diameter portions. The length in the Z-axis direction of the large diameter portion is longer than the length in the Z-axis direction of the small diameter portion. The multiple large diameter portions and the multiple small diameter portions are arranged alternately along the X-axis direction. The small diameter portion is formed at the first insulating region 71. The large diameter portion is formed at the second insulating region 72.

Figures 13C, 13D:
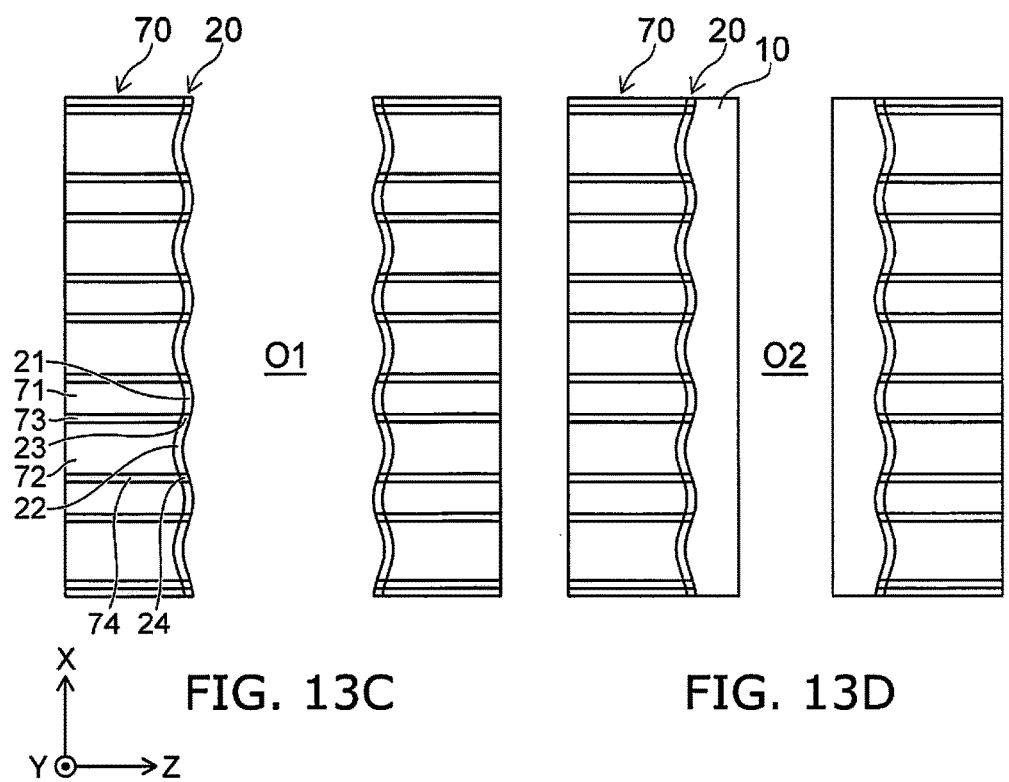

A metal layer is formed on the inner wall of the first opening O1. The metal layer and the first insulating portion 70 are heated. The first element is diffused from the first insulating region 71 and the second insulating region 72 into the metal layer by heat treatment. As a result, as illustrated in FIG. 13C, the first region 21, the second region 22, the third region 23, and the fourth region 24 are formed in the metal layer. The portions of the metal layer where the first element diffuses corresponds to the first region 21 and the second region 22. The metal layer that includes the first region 21, the second region 22, the third region 23, and the fourth region 24 corresponds to the first member 20.

A magnetic layer is formed in the first opening O1 interior; and the first opening O1 is filled. As illustrated in FIG. 13D, the first magnetic portion 10 that has a tubular configuration is formed by forming a second opening O2 in the magnetic layer. An insulating layer may be formed further in the second opening O2 interior.

Figure 14:
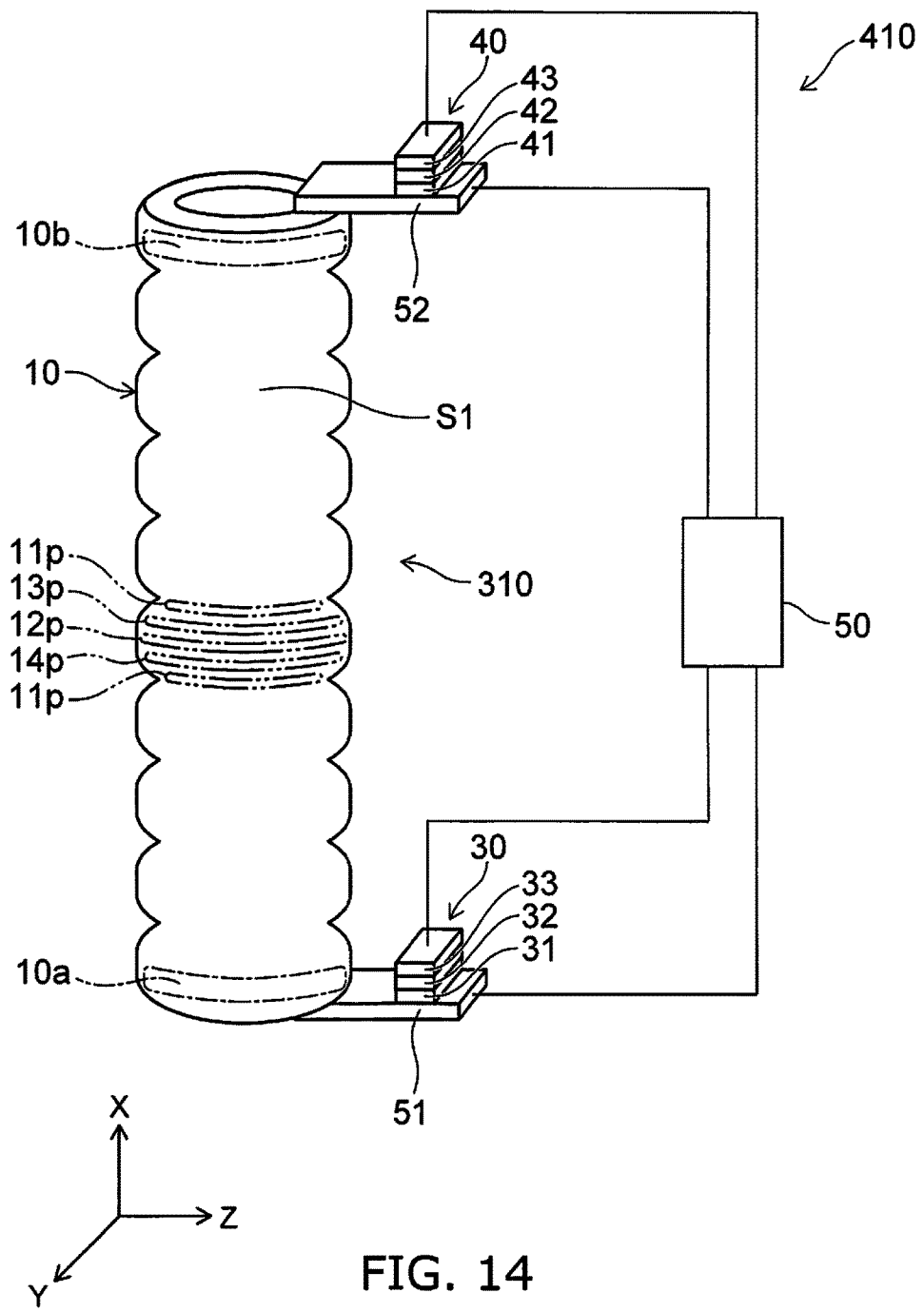
FIG. 14 is a schematic perspective view illustrating a magnetic memory device according to a fourth embodiment.

FIG. 14 is a schematic perspective view illustrating a magnetic memory device according to a fourth embodiment.

The magnetic memory device 410 illustrated in FIG. 14 includes the magnetic element 310, the read portion 30, the write portion 40, and the controller 50.

The first connection region 10a of the first magnetic portion 10 is connected to a first connection magnetic portion 51. The read portion 30 is connected to the first connection magnetic portion 51. The read portion 30 is electrically connected to the first magnetic portion 10 via the first connection magnetic portion 51. The read portion 30 reads the magnetization information of the magnetic domain of the first connection magnetic portion 51.

The first magnetic portion 10 is connected to a second connection magnetic portion 52. The write portion 40 is connected to the second connection magnetic portion 52. The write portion 40 is electrically connected to the first magnetic portion 10 via the second connection magnetic portion 52. The write portion 40 writes the magnetization information to the second connection magnetic portion 52.

The controller 50 is electrically connected to the first connection magnetic portion 51 and the second connection magnetic portion 52. For example, the domain wall of the first magnetic portion 10 moves to the first connection magnetic portion 51 when the controller 50 causes the first current to flow from the first connection magnetic portion 51 toward the second connection magnetic portion 52 (causes the electrons to flow from the second connection magnetic portion 52 toward the first connection magnetic portion 51). The read portion 30 reads the magnetization information of the magnetic domain moved to the first connection magnetic portion 51. When the controller 50 causes the first current to flow, the magnetic domain of the second connection magnetic portion 52 written by the write portion 40 moves to the first magnetic portion 10.

The multiple magnetization information that is stored in the first magnetic portion 10 can be read continuously by alternately performing the reading of the magnetization information of the first connection magnetic portion 51 and the supply of the first current. By alternately performing the writing of the magnetization information to the second connection magnetic portion 52 and the supply of the first current, the magnetization information can be written continuously to the first magnetic portion 10.

Figure 15:
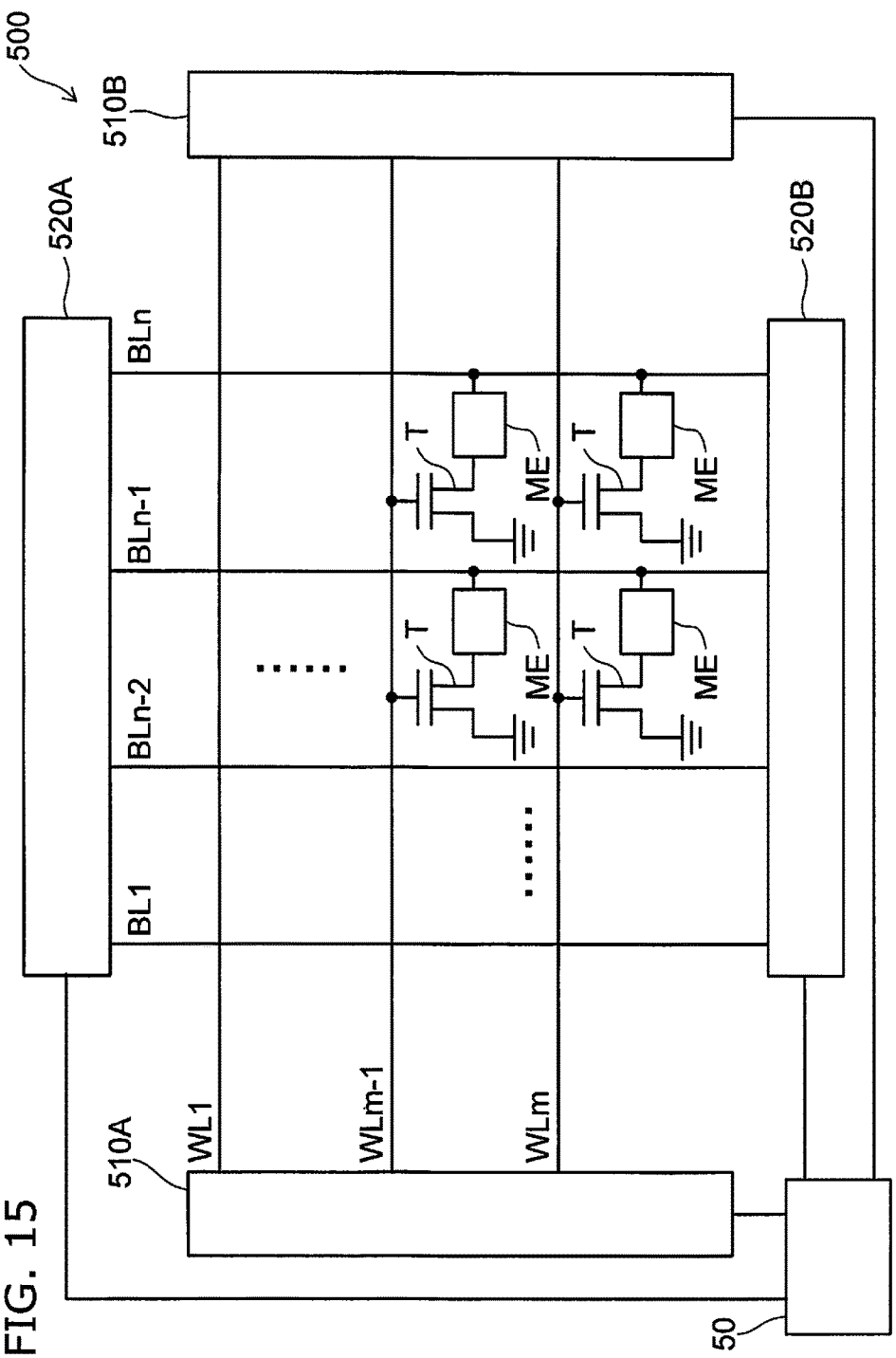
FIG. 15 is a circuit diagram of a magnetic memory device according to a fifth embodiment.

FIG. 15 is a circuit diagram of a magnetic memory device according to a fifth embodiment.

The magnetic memory device 500 illustrated in FIG. 15 includes multiple magnetic elements ME, multiple switching elements T, multiple word lines WL1 to WLm, and multiple bit lines BL1 to BLn. For example, the magnetic element ME is selected from the group consisting of the magnetic elements 110 to 150 and 310.

Each of the multiple transistors includes a first terminal, a second terminal, and a gate. The multiple first terminals are electrically connected respectively to the second connection regions 10b of the multiple magnetic elements ME. The multiple gates are electrically connected to the multiple word lines WL1 to WLm. The multiple second terminals are connected to a fixed potential. The multiple bit lines BL1 to BLn are electrically connected to the first connection regions 10a of the multiple magnetic elements ME.

The multiple word lines WL1 to WLm are electrically connected to drive circuits 510A and 510B that include decoders, write circuits, etc., that select each interconnect. The bit fines BL1 to BLn are electrically connected to drive circuits 520A and 520B that include decoders, read circuits, etc., that select each interconnect.

The read portion 30 and the write portion 40 of the magnetic element ME are not illustrated in FIG. 15. For example, one end of the read portion 30 is electrically connected to a not-illustrated switching element. The other end of the read portion 30 is electrically connected to a not-illustrated current source. One end of the write portion 40 is electrically connected to another not-illustrated switching element. The other end of the write portion 40 is electrically connected to a not-illustrated current source.

The drive circuits 510A, 510B, 520A, and 520B are electrically connected to the controller 50. The decoders in the interiors of the drive circuits 510A, 510B, 520A, and 520B decode the address signals that are input. One of the multiple magnetic elements ME is selected according to the decoded address. A current is supplied to the first magnetic portion 10 of the selected magnetic element ME. The domain walls are moved.

According to the embodiments described above, a magnetic element and a magnetic memory device are provided in which the operational stability improves.

The embodiments may include the following configurations (e.g., technological proposals).

Configuration 1

A magnetic element, comprising:
a first member including multiple first concentration regions and a second concentration region, the multiple first concentration regions being arranged along a first direction, the second concentration region being positioned between one of the multiple first concentration regions and another one of the multiple first concentration regions, the multiple first concentration regions and the second concentration region including at least one first element selected from the group consisting of Au, Ir, Al, Ta, TaN, W, Hf, Pt, and Pd, a first concentration of the first element in the one of the multiple first concentration regions being higher than a second concentration of the first element in the second concentration region; and
a first magnetic portion, a direction from the multiple first concentration regions toward the first magnetic portion being aligned with a second direction crossing the first direction.

Configuration 2

The magnetic element according to Configuration 1, wherein
the first magnetic portion has a first surface and a second surface,
the first surface is positioned between the second surface and the first member in the second direction,
the first surface includes multiple first top portions and multiple first bottom portions, and
the multiple first top portions and the multiple first bottom portions are arranged alternately along the first direction.

Configuration 3

The magnetic element according to Configuration 2, wherein
a direction from one of the multiple first concentration regions toward one of the multiple first top portions is aligned with the second direction, and
a direction from another one of the multiple first concentration regions toward one of the multiple first bottom portions is aligned with the second direction.

Configuration 4

The magnetic element according to Configuration 1, wherein
the first magnetic portion has a first surface and a second surface,
the first surface is positioned between the second surface and the first member in the second direction,
the second surface includes multiple second top portions and multiple second bottom portions, and
the multiple second top portions and the multiple second bottom portions are arranged alternately along the first direction.

Configuration 5

The magnetic element according to Configuration 4, wherein
a direction from one of the multiple first concentration regions toward one of the multiple second top portions is aligned with the second direction, and
a direction from another one of the multiple first concentration regions toward one of the multiple second bottom portions is aligned with the second direction.

Configuration 6

A magnetic element, comprising:
a first magnetic portion extending in a first direction; and
a first member provided around the first magnetic portion, a direction from the first member toward the first magnetic portion crossing the first direction, the first member including a first region, a second region, and a third region positioned between the first region and the second region in the first direction, the first region including at least one first element selected from a first group consisting of Au, Ir, Al, Ta, and Hf, the second region including at least one second element selected from the first group, the third region including at least one third element selected from a second group consisting of W, Pt, Pd, and TaN.

Configuration 7

The magnetic element according to Configuration 6, further comprising an insulating portion,
the first member being positioned between the insulating portion and the first magnetic portion in a direction crossing the first direction,
the insulating portion including a first insulating region, a second insulating region, and a third insulating region,
the first region being positioned between the first magnetic portion and the first insulating region in a direction crossing the first direction,
the second region being positioned between the first magnetic portion and the second insulating region in a direction crossing the first direction,
the third region being positioned between the first magnetic portion and the third insulating region in a direction crossing the first direction,
the first insulating region including the first element,
the second insulating region including the second element,
the third insulating region including the third element.

Configuration 8

The magnetic element according to Configuration 6 or 7, wherein the first magnetic portion has a first surface and a second surface, the first surface is positioned between the first member and the second surface in a direction crossing the first direction, the first surface includes a first portion, a second portion, and a third portion, the second surface includes a first opposing portion, a second opposing portion, and a third opposing portion, the first portion is positioned between the first opposing portion and the first region in a direction crossing the first direction, the second portion is positioned between the second opposing portion and the second region in a direction crossing the first direction, the third portion is positioned between the third opposing portion and the third region in a direction crossing the first direction, and a distance along a direction crossing the first direction between the third portion and the third opposing portion is longer than a distance along a direction crossing the first direction between the first portion and the first opposing portion and shorter than a distance along a direction crossing the first direction between the second portion and the second opposing portion.

Configuration 9

A magnetic memory device, comprising:

the magnetic element according to any one of Configurations 1 to 8; and a controller, the first magnetic portion including a first connection region and a second connection region, the controller being electrically connected to the first connection region and the second connection region, the controller performing a first operation and a second operation, in the first operation, the controller supplying a first current between the first connection region and the second connection region, in the second operation after the first operation, the controller not supplying a current between the first connection region and the second connection region.

Configuration 10

A magnetic memory device, comprising:

the magnetic element according to any one of Configurations 1 to 8; and a controller, the first magnetic portion including a first connection region and a second connection region, the controller being electrically connected to the first connection region and the second connection region, the controller performing a first operation and a second operation, in the first operation, the controller supplying a first current between the first connection region and the second connection region, in the second operation after the first operation, the controller supplying a second current between the first connection region and the second connection region, the absolute value of a current value of the second current being less than the absolute value of a current value of the first current.

Configuration 11

The magnetic memory device according to Configuration 9 or 10, further comprising:

a switching element including a first terminal, a second terminal, and a gate;

a word line; and a bit line, the first terminal being electrically connected to the first connection region, the second terminal being connected to a fixed potential, the gate being connected to the word line, the bit line being electrically connected to the second connection region.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the magnetic element and the magnetic memory such as the first magnetic portion, the first member, the read portion, the write portion, the controller, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all magnetic elements and all magnetic memories practicable by an appropriate design modification by one skilled in the art based on the magnetic elements and the magnetic memories described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic element, comprising:
a first magnetic portion extending in a first direction; and
a first member provided around the first magnetic portion,
a direction from the first member toward the first magnetic portion crossing the first direction, the first member including a first region, a second region, and a third region positioned between the first region and the second region in the first direction, the first region including at least one first element selected from the group consisting of Au, Ir, Al, Ta, TaN, W, Hf, Pt, and Pd, the second region including at least one second element selected from the group, the third region including at least one third element selected from the group, a concentration of the third element in the third region being lower than a concentration of the first element in the first region and lower than a concentration of the second element in the second region.

2. The element according to claim 1, further comprising an insulating portion,
the first member being positioned between the insulating portion and the first magnetic portion in a direction crossing the first direction,
the insulating portion including a first insulating region, a second insulating region, and a third insulating region,
the first region being positioned between the first magnetic portion and the first insulating region in a direction crossing the first direction,
the second region being positioned between the first magnetic portion and the second insulating region in a direction crossing the first direction,
the third region being positioned between the first magnetic portion and the third insulating region in a direction crossing the first direction,
a concentration of the third element in the third insulating region being lower than a concentration of the first element in the first insulating region and lower than a concentration of the second element in the second insulating region.

3. The element according to claim 1, wherein
the first magnetic portion has a first surface and a second surface,
the first surface is positioned between the first member and the second surface in a direction crossing the first direction,
the first surface includes a first portion, a second portion, and a third portion,
the second surface includes a first opposing portion, a second opposing portion,
and a third opposing portion,
the first portion is positioned between the first opposing portion and the first region in a direction crossing the first direction,
the second portion is positioned between the second opposing portion and the second region in a direction crossing the first direction,
the third portion is positioned between the third opposing portion and the third region in a direction crossing the first direction, and
a distance along a direction crossing the first direction between the third portion and the third opposing portion is longer than a distance along a direction crossing the first direction between the first portion and the first opposing portion and shorter than a distance along a direction crossing the first direction between the second portion and the second opposing portion.

4. A magnetic memory device, comprising:
the magnetic element according to claim 1; and
a controller,
the first magnetic portion including a first connection region and a second connection region,
the controller being electrically connected to the first connection region and the second connection region,
the controller performing a first operation and a second operation,
in the first operation, the controller supplying a first current between the first connection region and the second connection region,
in the second operation after the first operation, the controller not supplying a current between the first connection region and the second connection region.

5. A magnetic memory device, comprising:
the magnetic element according to claim 1; and
a controller,
the first magnetic portion including a first connection region and a second connection region,
the controller being electrically connected to the first connection region and the second connection region,
the controller performing a first operation and a second operation,
in the first operation, the controller supplying a first current between the first connection region and the second connection region,
in the second operation after the first operation, the controller supplying a second current between the first connection region and the second connection region,
the absolute value of a current value of the second current being less than the absolute value of a current value of the first current.

* * * * *